(12) United States Patent
Anttila et al.

(10) Patent No.: US 8,152,921 B2
(45) Date of Patent: Apr. 10, 2012

(54) CRYSTAL MANUFACTURING

(75) Inventors: Olli Anttila, Espoo (FI); Ari Saarnikko, Tuusula (FI); Jari Paloheimo, Espoo (FI)

(73) Assignee: Okmetic Oyj, Vantaa (FI)

( * ) Notice: Subject to any disclaimer, the term of this patent is extended or adjusted under 35 U.S.C. 154(b) by 1019 days.

(21) Appl. No.: 11/514,177

(22) Filed: Sep. 1, 2006

(65) Prior Publication Data

US 2008/0053372 A1    Mar. 6, 2008

(51) Int. Cl.
*C30B 15/04* (2006.01)
(52) U.S. Cl. ......... 117/210; 117/214; 117/217; 117/218
(58) Field of Classification Search ........... 117/200–220
See application file for complete search history.

(56) References Cited

U.S. PATENT DOCUMENTS

| | | | |
|---|---|---|---|
| 4,330,362 A | | 5/1982 | Zulehner |
| 4,956,153 A | * | 9/1990 | Yamagishi et al. ........... 117/217 |
| 5,126,114 A | * | 6/1992 | Kamio et al. ................. 117/213 |
| 5,260,037 A | * | 11/1993 | Kitaura et al. ................ 117/217 |
| 5,312,600 A | * | 5/1994 | Kamio et al. ................. 117/213 |
| 5,361,721 A | * | 11/1994 | Takano et al. ................ 117/214 |
| 5,363,795 A | * | 11/1994 | Kanada et al. ................. 117/13 |
| 5,373,805 A | * | 12/1994 | Takano et al. ................. 117/18 |
| 5,437,242 A | * | 8/1995 | Hofstetter et al. ............. 117/14 |
| 5,443,034 A | * | 8/1995 | Everts .......................... 117/208 |
| 5,476,065 A | * | 12/1995 | Ikezawa et al. .............. 117/217 |
| 5,573,591 A | * | 11/1996 | Ikezawa et al. ................ 117/20 |
| 5,578,123 A | * | 11/1996 | Vilzmann et al. .............. 117/13 |
| 5,730,799 A | * | 3/1998 | Ito ................................ 117/217 |
| 5,904,768 A | * | 5/1999 | Holder ........................... 117/20 |
| 5,925,147 A | * | 7/1999 | Ito ................................. 117/15 |
| 5,942,032 A | * | 8/1999 | Kim et al. ...................... 117/13 |
| 2008/0053372 A1 | * | 3/2008 | Anttila et al. ................ 117/200 |

\* cited by examiner

*Primary Examiner* — Bob M Kunemund
(74) *Attorney, Agent, or Firm* — Birch, Stewart, Kolasch & Birch, LLP

(57) ABSTRACT

An implementation of a Czochralski-type crystal growth has been shown and embodied. More particularly, a furnace with suitable insulation and flow arrangement is shown to improve the cost-efficiency of production of crystals. That is achieved by the shown new hot-zone structure, gas flows and the growth process which can decrease the power consumption, increase the lifetime of hot-zone parts and improve the productivity, e.g., by giving means for opening the hot-zone and easily adapting the hot-zone to a new crystal diameter.

11 Claims, 10 Drawing Sheets

CRYSTAL MANUFACTURING

FIELD OF THE INVENTION

Figure 1:
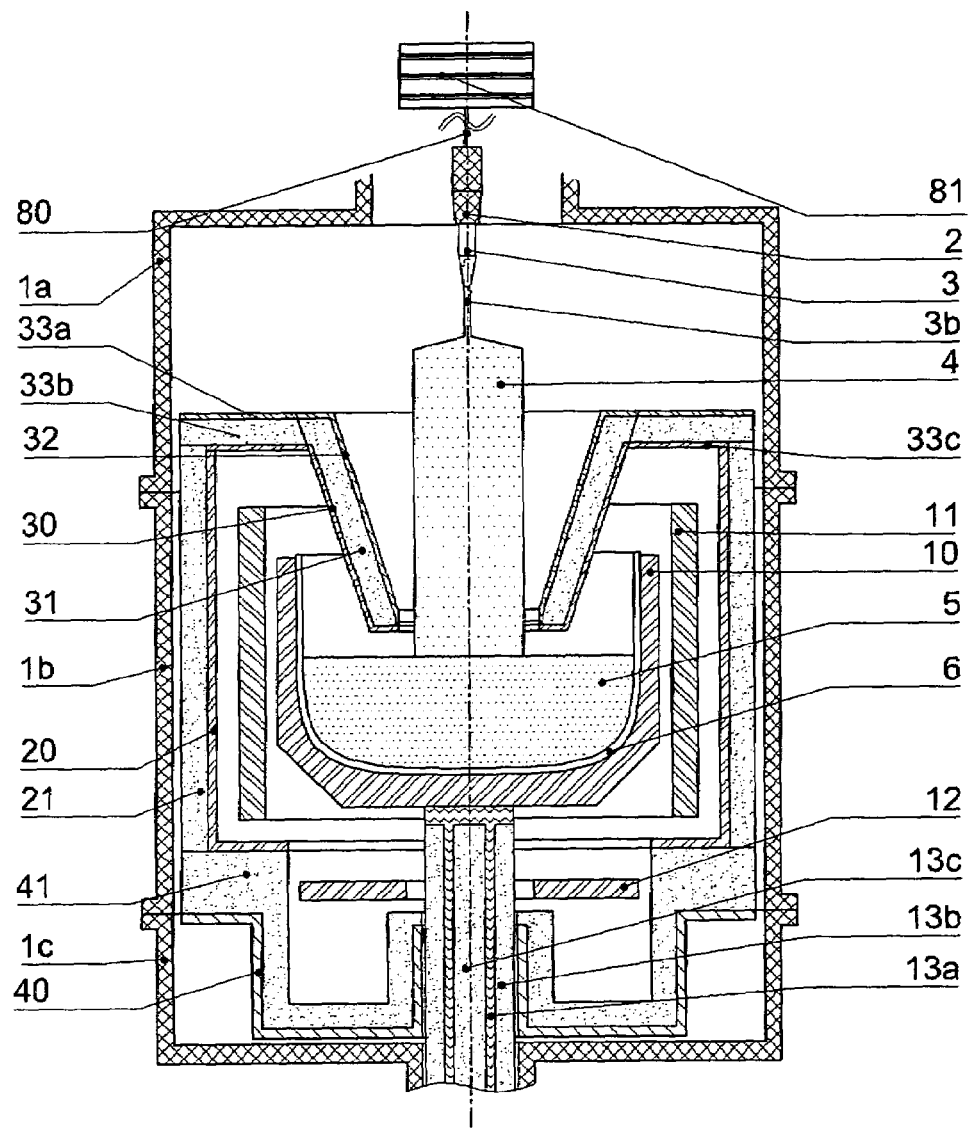

The invention relates to an apparatus and a method of manufacturing crystals by means of the Czochralski-related technique in general level, but more particularly to an apparatus and a method, which improve the cost-efficiency of production of crystals, especially semiconductor crystals. The invention relates to a flow arrangement according to the preamble of an independent claim on a flow arrangement. The invention relates to a flow arrangement system according to the preamble of an independent claim on a flow arrangement system. The invention relates to a thermal arrangement according to the preamble of an independent claim on a thermal arrangement. The invention relates to a thermal arrangement system according to the preamble of an independent claim on a thermal arrangement system. The invention relates to a hot-zone structure according to the preamble of an independent claim on a hot-zone structure. The invention relates to a furnace according to the preamble of an independent claim on a furnace. The invention concerns also a growing method of crystals according to the preamble of an independent claim thereof. The invention concerns also a crystal according to the preamble of an independent claim thereof.

BACKGROUND

Semiconductor single crystals are commonly fabricated using the Czochralski method. The semiconductor charge, e.g. silicon, is melted in a crucible made, e.g., of silica, by using heating element(s) around the crucible in a chamber. An inert gas flow, typically argon, is used to flush the furnace and the melt surface. A pulling mechanism is located above the crucible to pull the crystal from the melt. The heat-resistant parts inside the main vacuum chamber of the crystal pulling furnace, which forms the so-called hot-zone, are typically made of graphite and thermally insulating soft and/or rigid graphite felt. Various other materials (e.g. metals, composites or refractory materials) or coatings (e.g. SiC on graphite) are known to be used to some extent in the hot-zone. The crucible, heater and insulated tubular heat shield around the heater are some of the typical parts of the hot-zone in known techniques. It is also known in a basic crystal growing process that magnetic field may be used to control melt flow and/or crystal properties, e.g. oxygen concentration, and to improve the growth yield. Use of an additional bottom heater located under the crucible to be used during melting and/or growing of the crystal, to shorten the melting time and to optimize the temperature distributions in the hot-zone, is also known before as such.

The hot-zone design has an important effect on the total cost and quality of the crystals and productivity. However, the earlier hot-zones typically had a design that led to very high heat loss and heating power consumption because of the limited or locally missing thermal insulation, and at the same time, the design also led to poor gas flow characteristics that increased the gas consumption while still giving a relatively low crystal yield because of particle formation in harmful positions and reaching the melt, low lifetime of the hot-zone parts because of strong reactions at their surfaces and/or low quality of the crystals with respect to contamination or other quality aspects. The resulting relatively high cost for electricity, gas and graphite parts, combined with poor crystal yield and quality as well as the extra time needed for cleaning the furnace or for replacing the hot-zone parts, increased the total production cost per usable crystal length. Furthermore, the lowered productivity has been problematic. Additional problems can be related to the lack of stability/process reproducibility because of the corrosion/erosion of graphite parts of the current hot-zones, and/or changes in properties of various surfaces, because of deposition of e.g. silicon containing vapors. Although several improvements in the hot-zone designs, to improve some of these aspects, have been made since and will be discussed below, the situation is still far from optimized.

In the prior hot-zone designs, not much attention has been paid to the power consumption while other aspects such as quality, productivity and yield have been more in the focus. The designs have often had very limited thermal insulation. Large areas in the upper parts of the hot-zone and often also in the lower parts may have only modest insulation, and thermal leakage through, e.g., the heater electrodes and crucible shaft lead-through and gas outlet from the hot-zone to the pump-line are very significant, or the thermal insulation has not even been specified at all in some areas/locations.

The improvements of the thermal insulation have often been local, concentrating in the region above the melt, and driven by the target to improve the crystal quality and/or to increase the pulling rate while the power consumption has not been much of concern and has not been properly addressed. However, although these designs partially shield the crystal from the thermal radiation from the hot melt and the hot-zone to allow higher pulling rates, they are not optimized or targeted to decrease the power consumption of the hot-zone as a whole. High power loss and power consumption also typically lead to higher maximum temperatures, at least locally, and to larger temperature non-homogeneity inside the hot-zone. These are harmful because they lower the lifetime of the hot-zone parts or cause a drift of the temperature distribution in the hot-zone and the crystal because of increased or locally enhanced reactions. As these changes become too large, the parts have to be replaced, which increases the cost and requires extra work and time, decreasing the productivity. Higher temperatures at the crucible-melt interface are also harmful to the crucible as they speed up the unfavorable changes in the crucible and also make the melt flow behavior less stable and lead to lower crystal yield.

The inert gas is, in most cases, introduced to the hot-zone from above, passing by the crystal and the melt surface, and finally, after passing through the hot-zone, flowing through outlets to the vacuum pump lines connected to the lower parts of the main vacuum chamber of the crystal grower. Earlier hot-zones did not much pay attention the gas flow geometry in the regions close to the melt surface while in modern known hot-zones a tubular or conical part above the melt is often used for this purpose, see, e.g., U.S. Pat. No. 4,330,362 as a solution to the hot-zone related problems. However, although guiding of the gas flow through such a part offers several advantages, it may also intensify the evaporation of species from the melt to a level where this becomes a problem. Furthermore, as most of the gas flow passes the melt surface, the accidental particles, which are released from the inner surfaces of the vacuum chamber above the hot-zone or from the upper surfaces of the hot-zone, have a large probability to be transported with the gas flow to reach the melt region where these particles can lead to dislocations in the crystal and, thus, lower yield, if they reach the melt and the melt-crystal interface. Such particles on the surfaces often originate from the materials used for the hot-zone, from reactions or condensation inside the furnace, or from the cleaning or maintenance operations. In addition to particulate-type contamination, vaporized contamination from various surfaces is detrimental, too, if it gains access to the melt surface.

The lifetime of graphite parts and methods to increase the lifetime by suitable gas flow routes and hot-zone design has been discussed in the known technology. However, the known gas routing solutions represent stand-alone solutions, in which the gas flow has been separated from the heater and/or the crucible, to lengthen their lifetime and/or the lifetime of other graphite-based parts, with no concern to e.g. temperature distribution. Furnaces of known designs, however, typically need a non-standard position of the exhaust line connection to the chamber, also special equipment for the gas system, and are not easily adopted for standard furnaces without major modifications of the furnace and the crystal growing process. Such designs are not easily adaptable as such to standard types of furnaces, and may have adverse impact on the potential auxiliary systems to be used in various processes.

After growing a crystal the furnace and the hot-zone have to be opened for cleaning or maintenance operations, which include for instance the removal of the used e.g. quartz or silica crucible and the residual material therein and possible removal of dust and other debris. The condition of the hot-zone can be checked and the furnace finally charged for the next batch. The ease of opening and handling of the hot-zone is a factor contributing to the productivity and to the total cost of the crystal growing, especially in the case of larger hot-zones, as there are large and heavy parts that cannot easily be lifted by hand, but this problem has not been much addressed in the literature so far. External apparatus could be used for lifting, but it is an expensive solution and requires some space and time for docking and undocking of the apparatus to the grower and/or to the hot-zone parts. Especially the handling of the hot-zone parts above the crucible in the known furnaces slower the cleaning and other required operations, and thus the production.

Flexibility of production often requires that the same grower is used to produce different crystal diameters. For example, if the same furnace is used to grow 8" and 6" silicon or germanium crystals, one hot-zone design is probably not useful nor optimized for both crystal diameters. The growth of a 6" crystal from a hot-zone design for 8" without any changes would lead to higher cost, lower productivity, lower crystal quality and/or lower crystal yield. There is a need for a hot-zone design and procedures in which only a minimum number of small, relatively inexpensive hot-zone parts are easily and quickly changed in the adaptation from one diameter to another.

SUMMARY OF THE INVENTION

The embodiments of the invention are aimed to solve or at least to mitigate the drawbacks of the known techniques. The aim can be achieved by the embodiments of the invention.

Embodiments of the invention show a hot-zone design, a flow arrangement for a grower, a furnace, and a method of using a hot-zone design, which can decrease the total production cost of the crystals and increase the productivity.

The current invention is based on the fact that it is noticed that a certain thermal insulation in combination with a certain flow at the upper part, i.e. in the pulling end of the arrangement of crystal pulling, considerably improves the temperature distribution in certain parts of the crystal, melt and/or close to the interface between the melt and the crystal to be pulled. Additionally, it is not only the crystal to have a certain desired temperature distribution, but also the temperature around the crucible is desired to be controllable with suitably small temperature differences. As a side effect, the formation, deposition and/or reactions of harmful substances with/to sensitive surfaces can be considerably decreased. Consequently, the corrosion of heating resistors can be slowed down. In addition, also other parts of the hot-zone last longer, the lifetime of the insulating material is extended and the chamber parts remain cleaner. In addition, the ease of opening and maintaining of the hot-zone arrangement is considerably improved by the embodiments of the invention. The ease of opening and maintaining that is brought up from the embodiments of the invention also contributes to low level of contamination and high degree of cleanliness inside the grower and the hot-zone.

It is quite difficult to improve the thermal insulation, unless one begins with a somehow systematic study to find out where the heat is lost, using preferably a good modeling software tool. We have noticed that harmless-looking discontinuities in the insulation may actually be quite significant. These weak spots for heat loss are also known as thermal or cold bridges. An example illustrates the role of structural graphite penetrating through the insulation of a hot-zone designed for silicon growth. Such breach of insulation is industry standard, as the hot-zone parts inside of the thermal insulation must be supported in an appropriate manner, which means proper contact to dimensionally stable structural materials. The typical temperature difference between inside and outside of hot-zone for silicon growth is about 800° C., and a single graphite plate in a hot-zone of 1 m outer diameter, the plate being only 6 mm thick where it breaks a 3 cm thick insulation, would cause a heat loss of the order of 10 kW. A further example: A 100 cm$^2$ hole in the insulation causes a typical heat loss of the order of 30 kW. Hot-zone designs for silicon need holes in several places, and, e.g. already the ones allowing purge gas to flow out of the hot-zone, have a combined area, which is commonly in this range of 100 cm$^2$.

Even after identifying the thermal bridges, the construction of such a hot-zone, where harmful effects of these weak spots for heat loss are properly addressed, is far from being straightforward. The challenges are caused e.g. by (1) Large temperature differences between areas inside and outside of the hot-zone insulation. (2) The limited space for insulation vs. cost of the grower and the hot-zone components. (3) High typical thermal conductivities of available structural materials. (4) Significant dimensional changes caused by large temperature differences in various parts of the hot-zone that need to be absorbed without loss of positional accuracy, or breakage of the parts.

The need for other parallel gas routes in addition to the flow guided to purge the melt surface, increases with improved thermal insulation of the hot-zone, for Czochralski growth of silicon. This is because better thermal insulation leads to lower temperatures at the interface between the quartz or silica crucible and the silicon melt, decreasing the dissolution rate of oxygen to the melt, which should be compensated by decreasing also the gas flow directly passing the melt surface and the evaporation of oxygen from the melt, to reach the oxygen concentrations specified for the crystal. The total gas flow should, however, be high enough to effectively flush the hot-zone to limit the reactions between the silicon oxide and the graphites, to keep the lifetime of the graphite parts long and keep the furnace cleaner from particles. Therefore, to avoid the drawbacks from too low argon gas flow, gas should be guided also through other routes to the hot-zone, especially in the case of thermally well-insulated hot-zone. Also the exact gas flow routes in the inner parts of the hot-zone, after the gas has already entered the hot-zone and passed the melt surface, are important.

It is noticed by the inventors that the thermal and gas flow design and characteristics of the hot-zone are connected via the aspects of the invention, and have a major impact on the crystal yield and quality, and they cannot be designed completely separately. The protective inert gas flow characteristics are affected by the hot-zone design, which defines the gas flow routes, and by the process parameters for the gas flow such as gas mass flow and pressure inside the growth chamber. On the other hand, any inlet or outlet in the hot-zone for the gases is also a potential leakage route for heat. The gas flow routes and characteristics have an effect on the following items:

(A) Lifetime of the hot-zone parts. For example, in the case of graphite or graphite felt parts, a silicon melt, and a crucible made of silica, the lifetime limitation is largely due to reactions between silicon oxide and graphite, leading to silicon carbide formation on the graphite surfaces and changes in the material properties such as thermal conductivity, emissivity and, in the case of the heater, resistivity or, finally, even breakage. The changes, especially if unevenly distributed in the hot-zone, will change the temperature distribution in the hot-zone and the crystal, which could lead to non-optimized process conditions and, thus, lower crystal yield and/or crystal quality. For example, the oxygen concentration of the crystal could drift from its target value, or loss of single crystalline structure may result.

(B) The crystal yield. The gas flow purges the species (e.g. SiO) evaporating from the melt and prevents the formation of particles (e.g. of SiO) close to the melt surface, where they could reach the melt and, finally, the crystal-melt interface, often leading to dislocation formation, which would make the crystal or part of it useless, decreasing the crystal yield. Additionally, further contaminants/deposits can form in or originate from the farther parts in the furnace downstream the melt surface. Such contaminants can comprise a gaseous and/or particulate phase, which can drift to the melt. Highly doped crystals (with As, Sb, P, for example) necessitate also high concentrations of the dopants in the melt, and the doping elements may evaporate as oxides, which may later form particles, or they may cause wear of the hot-zone parts they are brought to contact with.

(C) Oxygen concentration of the crystal. The gas flow in the vicinity of the melt surface has an effect on the evaporation rate of oxygen (e.g. as SiO or other oxygen containing gases or vapors) from the melt, and is among the main factors controlling the oxygen concentration of the crystal. In principle, a larger argon mass flow purging the melt surface would typically lead to a lower oxygen concentration in the crystal.

(D) Crystal impurities. One of the main impurities in silicon crystals is carbon. A large portion of carbon contamination originates from the reaction between the evaporating SiO gas and hot graphite parts, which generates CO gas that may reach the melt if the gas flow allows this, increasing the carbon concentration of the melt and the crystal.

(E) Gas consumption can be reduced by embodiments of the invention, and the related cost will be lower. Furthermore, the probability of having contaminants transported by the gas to the melt is lower.

In the following, a crystal manufacturing according to a Czochralski-type method or a Czochralski-type process refers to manufacturing of crystalline material in a process, in which a seed crystal or alike is brought into contact with melt that is contained in a crucible, for growing a crystal with the structure defined by the seed crystal.

In the following, the term "grower" is used to refer to such an arrangement that comprises the necessary parts for crystal manufacturing according to Czochralski-type. This includes for instance vacuum compatible chambers, the means to provide a suitable atmosphere and pressure in the growth chamber, as well as the required systems for moving the crucible and the crystal in an appropriate manner. A grower can comprise also several additional parts such as power supplies for several heaters of different types, control system, as well as permanent magnets and/or electromagnets.

In the following, the term "hot-zone" is used to refer to a such an arrangement that comprises the necessary parts inside of the grower vacuum chamber that are needed to create a suitable thermal and gas flow conditions for the crystal growth. A hot-zone comprises e.g. a crucible to contain the melt, one or several heaters of different types, as well thermal insulation around the crucible and/or the heater(s). Any part, if hanging down from the top part of the vacuum chamber and with no significant contribution to temperature distribution in the crucible, is not considered as being part of the hot-zone.

In the following, the term "furnace" is used to refer to the combination, which the grower and the hot-zone form together, and which can, if connected to proper electric power, cooling and gas systems, to be used for crystal growth as such.

In the following, the term "crucible" refers to any vessel suitable for containing a charge to be melted into a melt for a Czochralski-type process, irrespective of the material of the crucible and/or the fine structure of the crucible, if not otherwise particularly pointed out.

Also term "susceptor" has been used to refer to a certain kind of a crucible-shaped vessel. A "susceptor" is used to mechanically support the crucible, which contains the melt. If no susceptor is used, the word "susceptor" refers to the crucible itself.

In the following, the term "to pull" in relation to Czochralski-type method or process, is not limited only to a mere pulling, but rather expressing a relative movement of the seed crystal with respect to the solid-melt interface.

In the following, the term "heater" is used of a device that is used to convert other sources of energy to heat the charge, the crucible, the crystal or any other part inside the grower. The term "bottom heater" is used to describe a heater that is located below the level of the bottom of the crucible during the growth of the body of the crystal, for the most of its heating power. The term "main heater" is a heater that is located outside of the crucible outer radius for the majority of its heating power. The term "surface heater" is a heater that is located inside of the crucible outer radius, above the melt surface.

In the following, the term "vacuum" refers to a gaseous medium in under-pressure conditions, so that the meaning extends from the emptiness of outer space to the conditions of essentially normal atmospheric pressure. A term "vacuum chamber" refers to a vessel and/or arrangement capable of to achieving and/or to maintaining vacuum around the crucible. The term is also used for such a chamber that is capable of maintaining vacuum after no or just minor modifications, if the crystal growth process calls for pressures at or above the normal atmospheric pressure.

In the following a route or a channel for a fluid, such as gas, refers to a passage for the fluid that allows it to flow in the passage. So, the channel or route can be embodied in several ways. Route can be defined along a tube from its one end to another end, but also by two tubes or cylinders from which one surrounds the other leaving an annular space defining a channel, which is not limited only to co-axial tubes or cylinders. In the same way conical tubes, planar plates or rings may also define channels. A very large number of various channel shapes may be devised. Channels may also contain granular, porous, fibrous, or other such material that allows fluid to pass.

In the following, the term "dopant" refers to relatively small amounts of chemical elements other than the main constituents of the charge to be melted. These dopants belong typically to group III, IV or V in the periodic table of elements, and their concentration in the melt may vary from less than 0.1 ppb (part per billion) up to about 1 percent for electrically active dopants, and from less than 1 ppm (part per million) to several percent, if other properties than electrical conductivity or conductivity type of the melt and/or the crystal are addressed.

According to an embodiment of the invention a heater may have an approximate cylindrically symmetric geometry relative to the crystal and/or to the melt. However, according to another embodiment of the invention the heater can comprise nonsymmetrically mounted heater parts to balance the temperature distribution of the melt and/or crystal. According to a further embodiment the means that allow adjustment of the geometry between the heater(s) and the rest of the hot-zone, are used. According to an embodiment of the invention the geometry may be changed between two growths. According to an embodiment the geometry may be changed also during the growth process.

A flow arrangement according to the invention is characterized in that what has been said in the characterizing part of an independent claim on a flow arrangement. A flow arrangement system according to the invention is characterized in that what has been said in the characterizing part of an independent claim on a flow arrangement system. A thermal arrangement according to the invention is characterized in that what has been said in the characterizing part of an independent claim on a thermal arrangement. A thermal arrangement system according to the invention is characterized in that what has been said in the characterizing part of an independent claim on a thermal arrangement system. A hot-zone structure according to the invention is characterized in that what has been said in the characterizing part of an independent claim on a hot-zone structure. A furnace according to the invention is characterized in that what has been said in the characterizing part of an independent claim on a furnace. A growing method of crystals according to the invention is characterized in that what has been said in the characterizing part of an independent claim on a growing method of crystals. A crystal according to the invention is characterized in that what has been said in the characterizing part of an independent claim on a crystal.

Other embodiments of the invention are shown in the dependent claims as examples. The interface between the preamble part of the claim and the characterizing part in two part claims has been indicated by a bold font for expressions "characterized", "wherein" and/or "comprising" in such claims.

Embodiments of the invention make the manufacturing of semiconductor single crystals using the Czochralski-type method more cost-efficient while maintaining or improving the crystal quality, in respect of e.g. carbon impurity concentration, and crystal yield for the crystal to be sold as such and/or as wafers, in raw or as processed. The cost-efficiency of production of crystals is contributed, e.g., by the consumption and cost of electricity, inert gas and hot-zone parts, the amount and cost of operator work and any procedures contributing to the total cycle time of the growth process, as well as by the investment costs of the furnaces.

From the main object of improved cost-efficiency the following sub-objects are considered in the following:
(a) Decrease of the electric power consumption.
(b) Extension of the practical lifetime of expensive and slow-to-replace hot-zone parts, e.g. structural graphite parts and insulator parts. Furthermore, proper insulation and suitably uniform temperature distribution result into more reproducible growth process, even after the hot-zone components experience significant wear.
(c) Hot-zone structure allowing easy and cost-efficient adaptation of the hot-zone to a change in the crystal diameter. Achieving better cost-efficiency while maintaining or improving the crystal quality and crystal yield.
(d) Achieving better cost-efficiency by using embodiments of the invention, which are, as far as reasonably possible, compatible with standard crystal growing furnaces, without the need of expensive modifications to the furnace or without the need of expensive additional equipment.

To achieve these objects, in the embodiments of the invention, an apparatus and a method are provided. Embodiments of invention, more carefully described in the claims, comprise following aspects of the invention, the first aspect (i), the second aspect (ii), the third aspect (iii), the fourth aspect (iv), and the fifth aspect (v) referred in the following also by reference numerals (i)-(v), although many variations to the presented examples of the basic embodiments of the invention are possible (i) The hot-zone of the crystal-pulling furnace constructed to have a good and almost continuous thermal insulation, giving improved cost-efficiency.
(ii) Novel inert gas routes in which the gas entering the hot-zone through two different routes, giving improved flow pattern, so yielding an increase of the lifetime of the graphite parts and crystal yield and quality, with relatively low inert gas consumption.
(iii) Hot-zone design and connection of the related parts, which allows the lifting of hot-zone upper parts together with the top of the main vacuum chamber of the grower, using the lifting mechanism already in the puller.
(iv) Hot-zone allowing good adaptation from one crystal diameter to another diameter by easily changing only few relatively small and inexpensive parts in the hot-zone.
(v) Hot-zone design yielding savings in operator labor. The hot-zone design according to an embodiment of the invention keeps the furnace clean and easily accessible, and thus reduces the cleaning work of the hot-zone parts and of the growth chamber.

Although an individual embodiment may be directly relating to one aspect, such an embodiment can also relate also to another aspect directly or indirectly. Embodiments of the invention are combinable in suitable part, even from a category to another in suitable part.

Figure 1B:
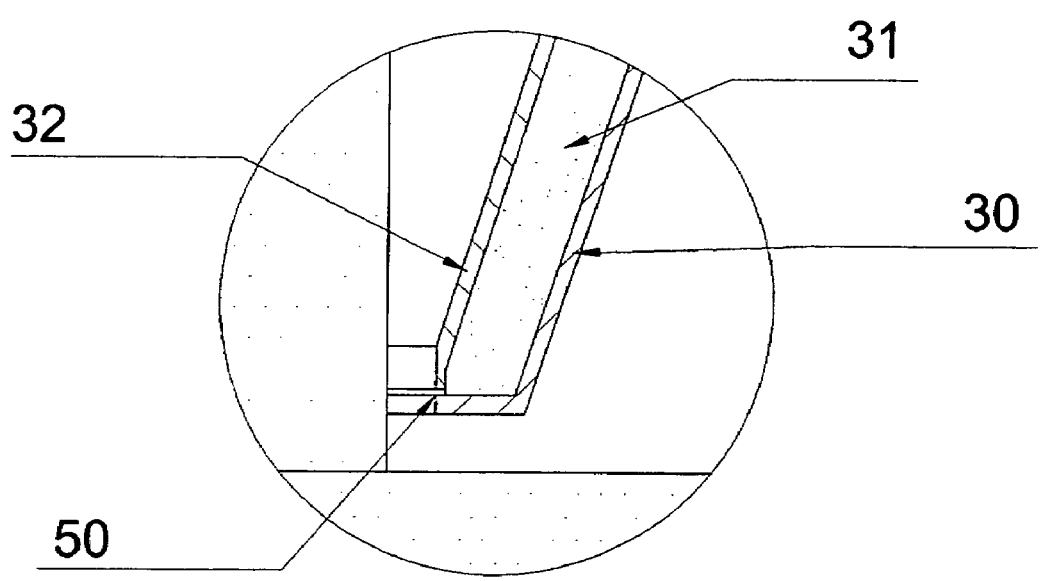
Figure 2:
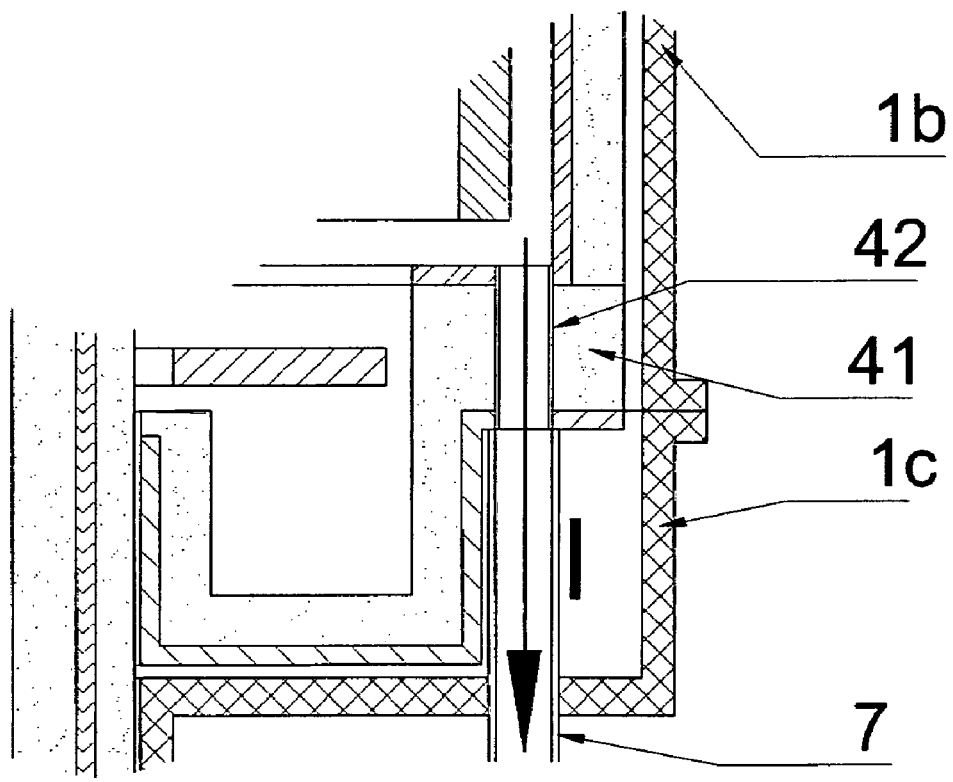
Figure 3:
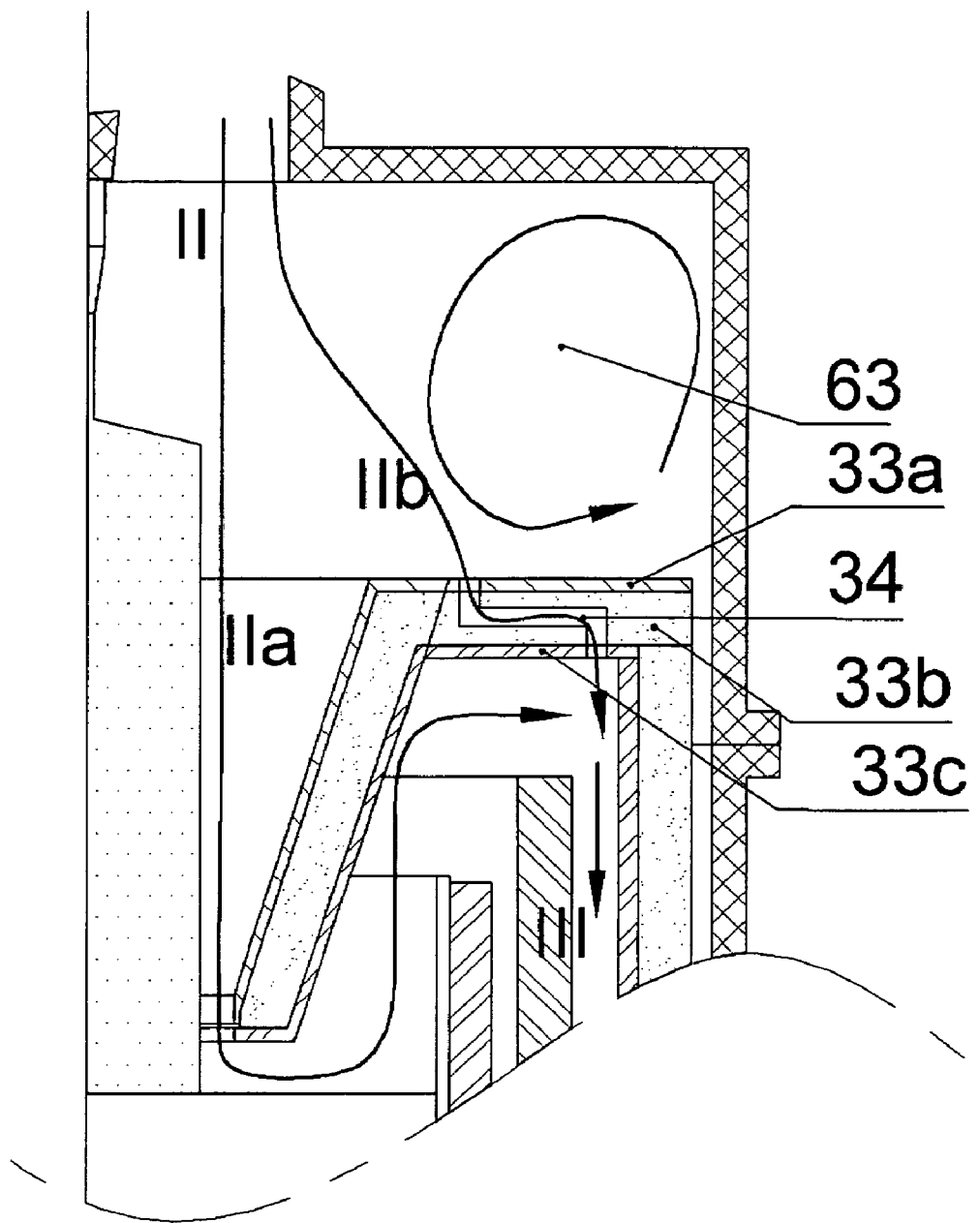
Figure 4:
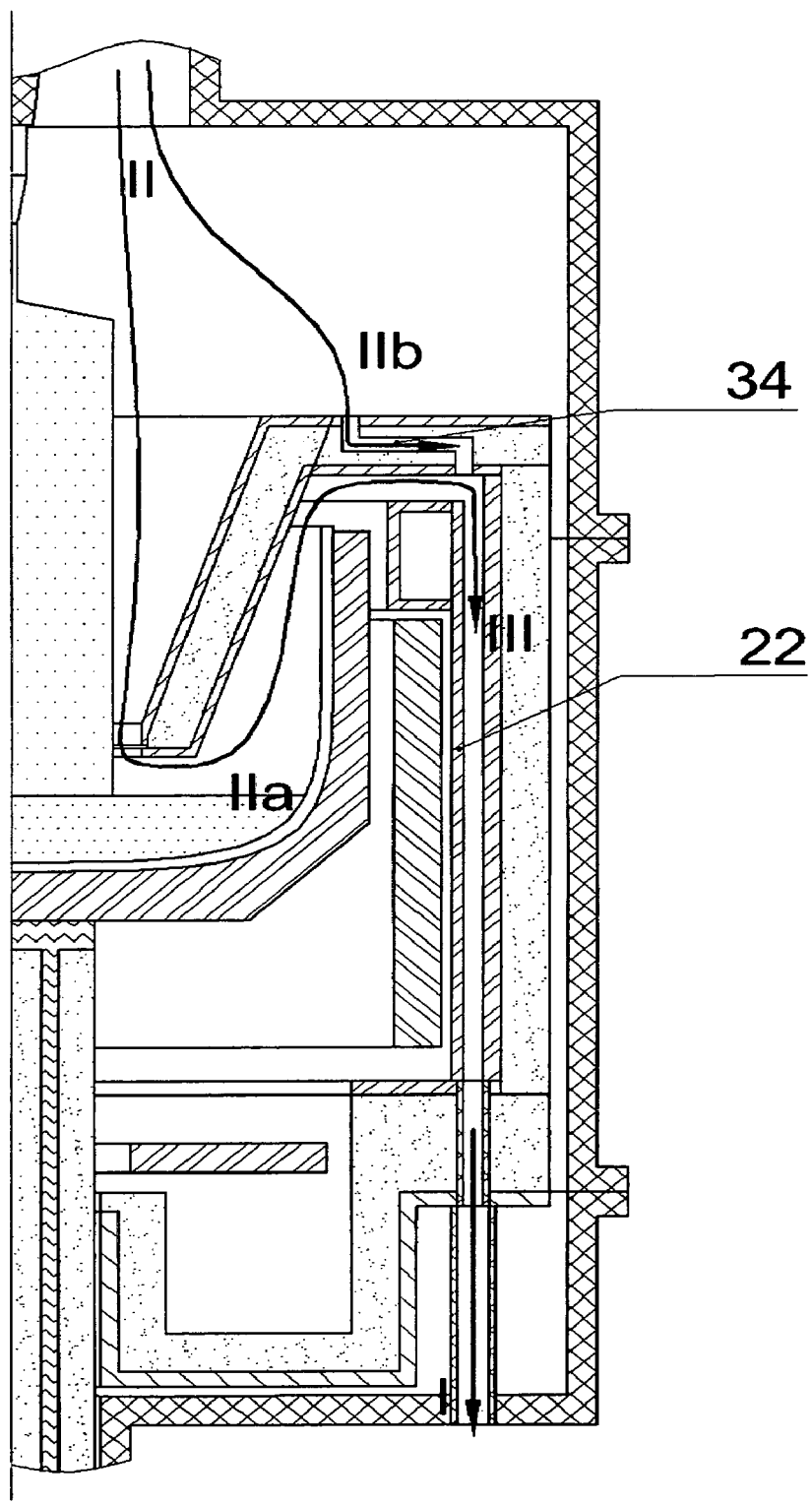
Figure 5:
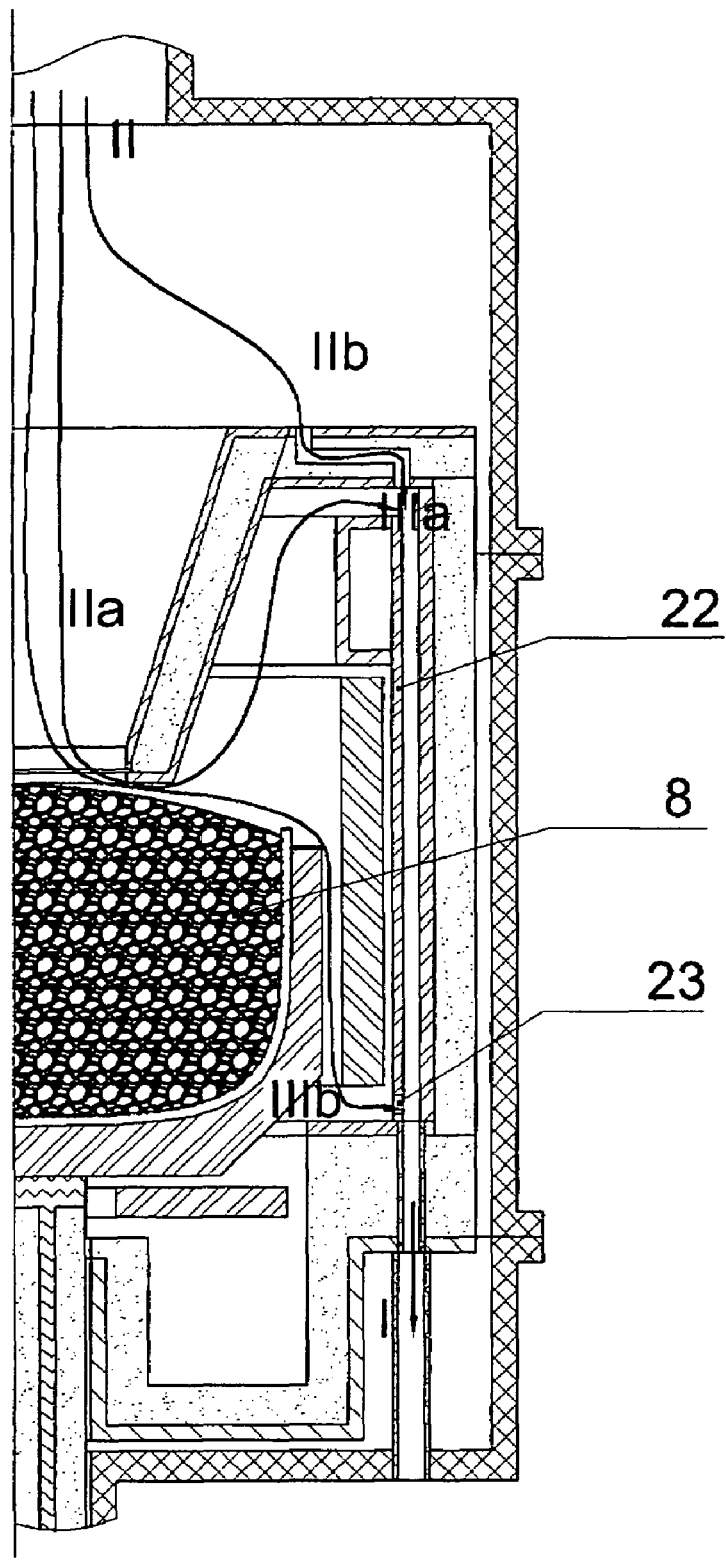
Figure 6:
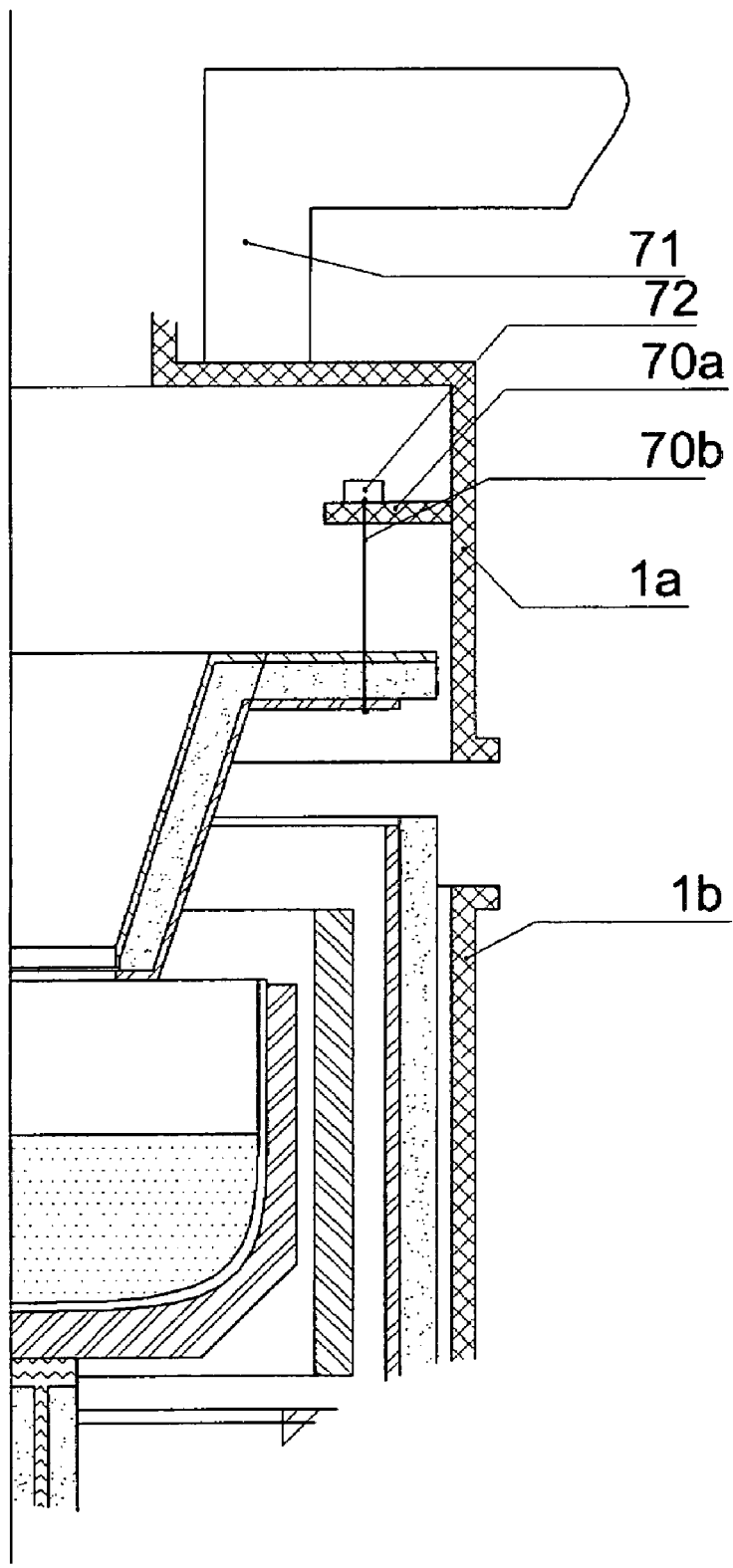
Figure 7:
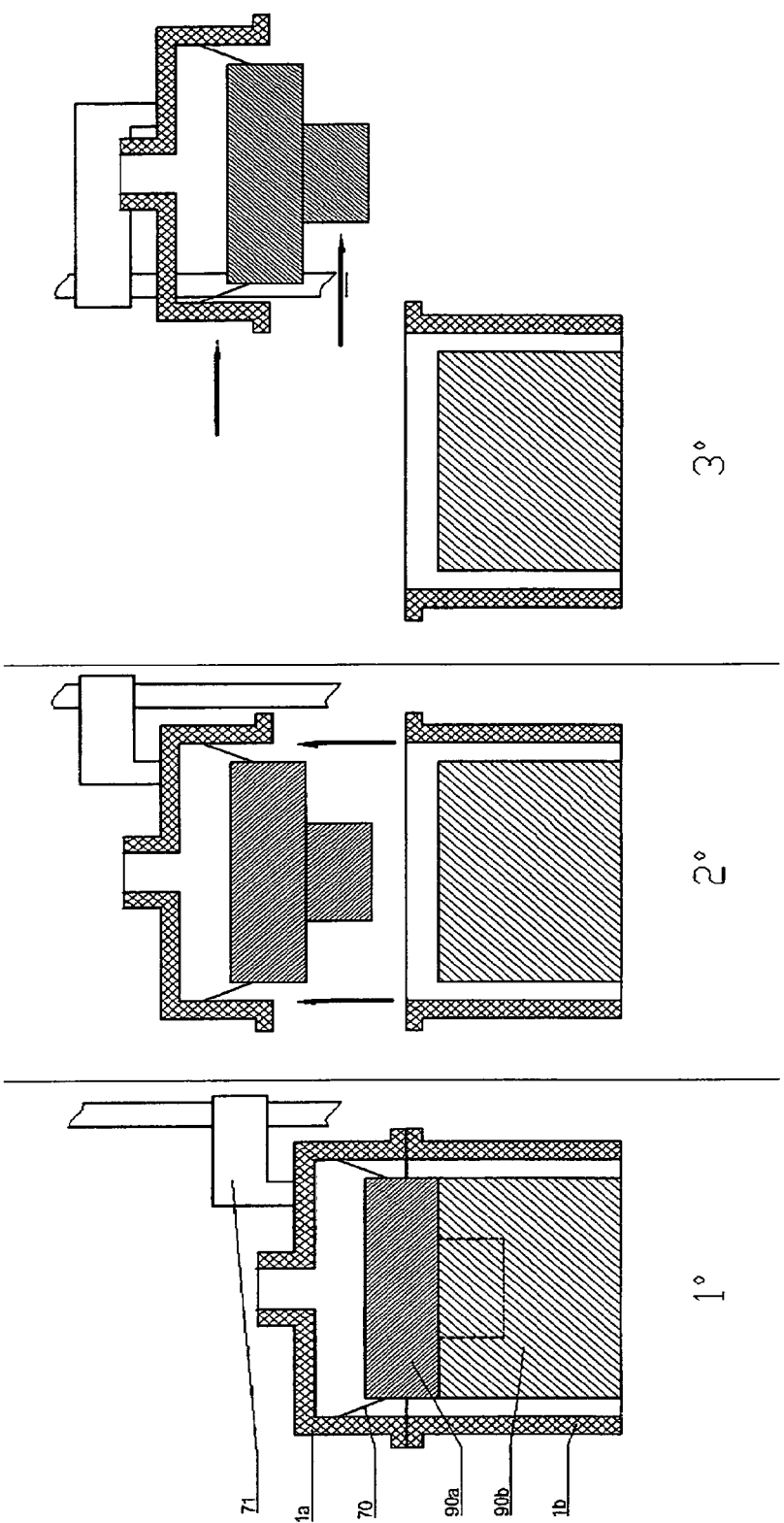
Figure 8:
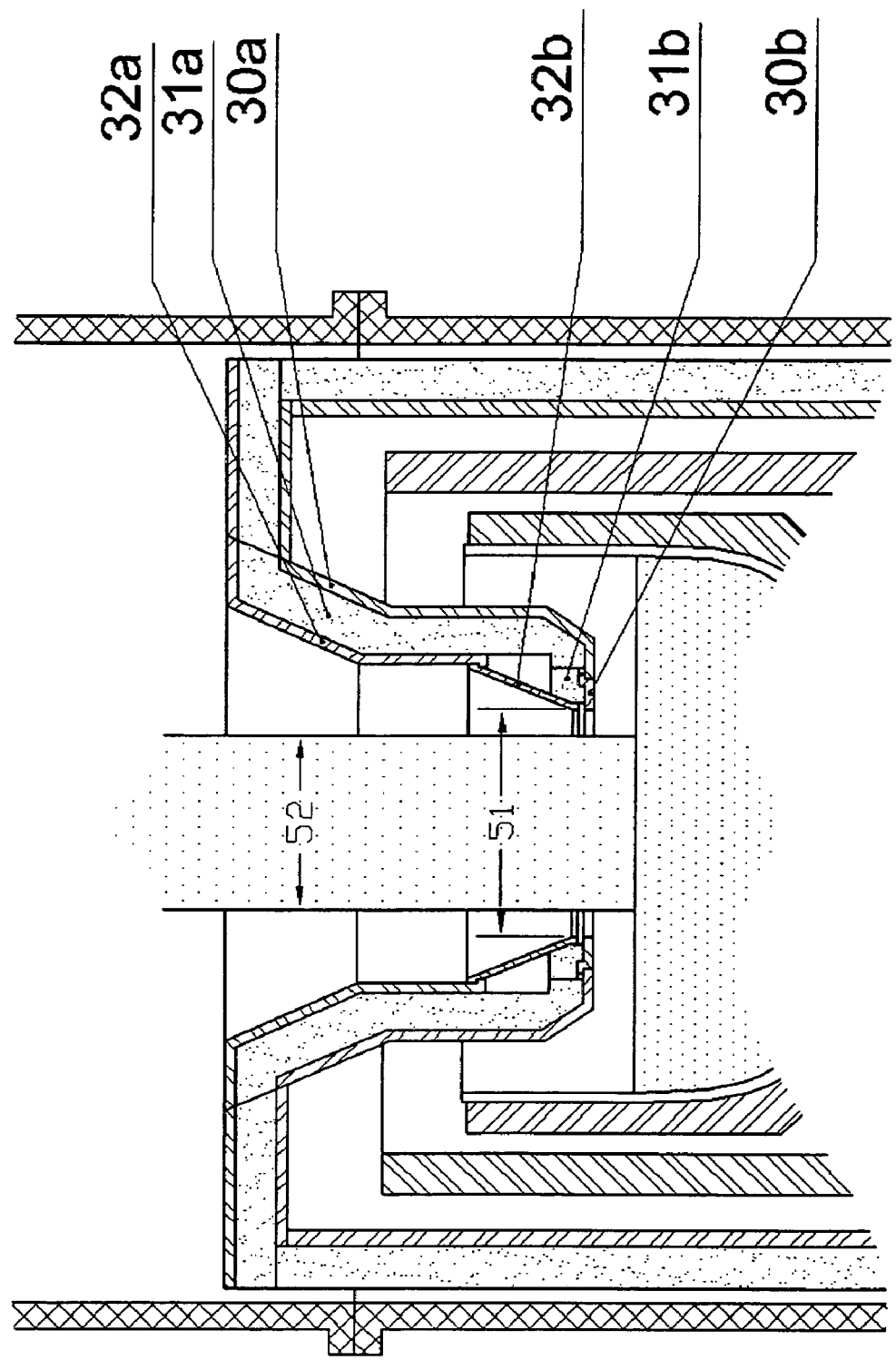

In the following, embodiments of the invention are described in more detail by referring to the following figures (FIG.) are shown as examples in which figures FIG. 1 illustrates a longitudinal section of a crystal manufacturing arrangement according to an embodiment of the invention, FIG. 1b illustrates as a detail of FIG. 1 in the hot-zone, FIG. 2 illustrates as a detail of a single crystal manufacturing arrangement, showing the design of the hot-zone at the gas outlet, FIG. 3 illustrates a detail in the crystal manufacturing arrangement as a longitudinal section, showing a gas flow routing in a hot-zone according to an embodiment of the invention, FIG. 4 illustrates a detail in crystal manufacturing arrangement, showing gas flow routes in a hot-zone design, FIG. 5 illustrates a detail in crystal manufacturing arrangement with an additional gas flow route in a hot-zone design, FIG. 6 illustrates schematically a detail in crystal manufacturing arrangement, including a hot-zone and demonstrating lift of the upper part of the chamber in the arrangement according to an embodiment of the invention, FIG. 7 illustrates further the chamber, its upper part and the hot-zone arrangement according to an embodiment of the invention, FIG. 8 illustrates schematically a detail in crystal manufacturing arrangement comprising an adaptable hot-zone for different crystal diameters according to an embodiment of the invention.

Figure 9:
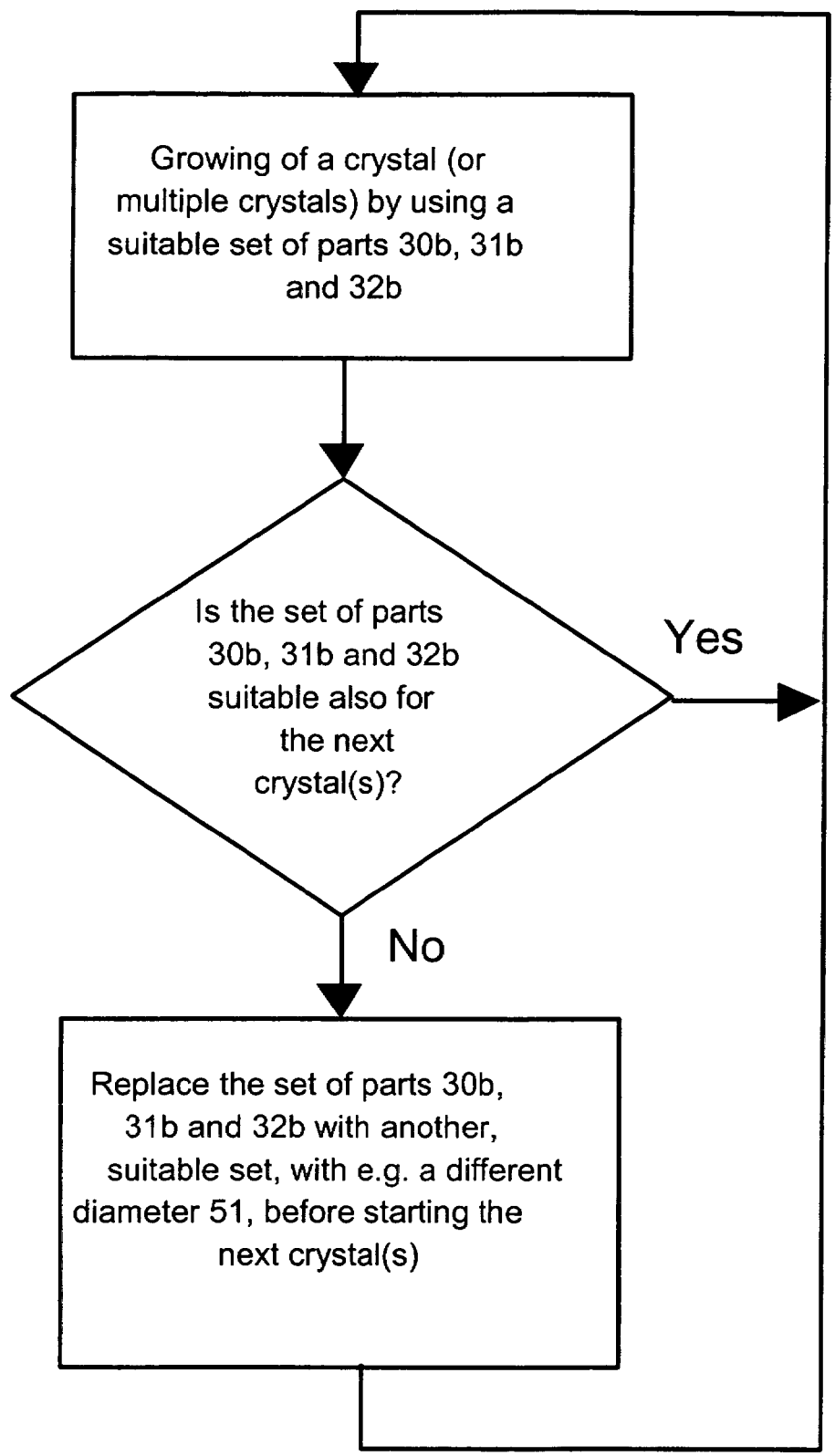

FIG. 9 illustrates as an example a flowchart of selecting the suitable hot-zone parts for a crystal manufacturing process.

The drawings are of illustrative character to show examples of embodiments of the invention without any intention to limit the scope to only shown embodiments. The measures of the objects shown in the drawings are not necessary in scale. Relative terms as "horizontal", "vertical", "up" or "down", "raised" or "lowered" are in relation to the mutual locations of the crystal, the crucible, and/or vacuum chamber of the grower or the parts thereof, and they are used only as examples in an illustrative manner to indicated mutual positions or their changes, but without particular commitment to the gravity and/or direction of the paper on which the drawings are shown. Thus a skilled man in the art knows that although in some examples the up and down are used as directions related to the document paper orientation and/or against or in direction of the gravity, in the real device the up and down are relative measures between certain objects that are movable in relation to the other. Various embodiments of the invention may also be utilized in suitable combinations.

DETAILED DESCRIPTION OF PREFERRED EMBODIMENTS

FIG. 1 illustrates the inside of a growth chamber in an embodiment of the invention, in a schematic manner. Support and control systems, which are needed to supply electricity, gases, vacuum, magnetic fields as well as rotation and/or lift of the crystal 4, melt 5, and/or crucible 6 etc., are not shown for reasons of simplicity.

Although the crystal has been illustrated in FIG. 1 in a co-axial geometry with the opening of the conical member or the crucible axis, the crystal and/or the crucible can in suitable part have a different axis of rotation. Thus, according to another embodiment, the crystal can be rotated along an axis that is clearly outside the rotation axis of the rotation axis of the crucible and/or the rotation axis of the melt. According to an embodiment of the invention the melt is rotated to provide a rotating movement in respect to the crystal. According to an embodiment of the invention, the crystal can be rotated in respect to the melt in a non-axial position of the crucible. According to an embodiment of the invention the crystal, melt and/or crucible can be rotated individually or in respect to each others with a different angular velocity. In an embodiment, the directions can be opposite. According to an embodiment of the invention the angular velocity of the melt can be essentially the same as the angular velocity of the crystal, but slightly different so allowing very slow relative movement at the interface, to be utilized for a material to be crystallized. However, a skilled man in the art realizes from the embodiments several ways to combine rotational movements of the melt, crucible and the crystal without leaving the scope of such embodiments of the invention.

According to an embodiment of the invention, the chamber 1 has a top part 1a, where the top refers only to the shown direction on the media. The chamber has also a bottom part 1c, but not necessarily a separate middle part 1b. At the cross-section of FIG. 1, the left and right walls of the chamber 1 are provided with flanges to indicate a facility to open the chamber, which while in operation has an internal atmosphere of near vacuum according to one embodiment, but kept according to another embodiment even in a considerably high over-pressure. Chamber according to an embodiment of the invention may also include more parts than shown in FIG. 1.

The shape of the cross section of the vacuum chamber in FIG. 1 has a rectangular form, however, shown as such only for reasons of simplicity, without any intention to restrict the shape of the grower chamber. So, the corners of the cross section of the cylindrical or tubular shape can be modified without leaving the scope of the invention. According to an embodiment of the invention the bottom part 1c and/or the top part 1a can be approximated by a segment of a sphere or another curved shape. In such an embodiment the curvature of the bottom and/or top parts can be used e.g. to direct a thermal radiation flux back to the inner parts of the furnace, to the hot-zone. The middle part 1b does not need to be cylindrical as in the shown embodiment as an example, but other shapes, such as barrel-like shapes for instance, are also possible. In FIG. 1, the top part 1a and the bottom part 1c include a tubular section each. However, these parts may also have designs with no tubular sections.

In FIG. 1 the crystal and crucible centerlines are depicted as being a single line. This is the standard industry practice, but a significant shift in the relative locations of the crystal and of the crucible is also possible. The center of the aperture in the lower edge of the conical member (parts 30, 31, and 32) could then also be shifted away from the crucible centerline.

FIG. 1 also demonstrates that the thermal insulation is extended all around the hot-zone, except for the hole above the melt, near the centerline of the hot-zone, through which hole the crystal 4 is pulled. The opening can be implemented in suitable size for the crystal 4 by the conical member, which has a suitably tight fit to the crystal, with a gap between the crystal 4 and the conical member. What is not shown, are unavoidable holes in the insulation for heater electrodes and purge gas etc. However, these holes are kept as few as possible, as small as possible to reduce the heat loss through these holes, but at the same time large enough to allow the passage of necessary electric current, mechanical support for the heaters, as well as the required cross section for the purge gas exhaust. Small additional openings may also be included, e.g. for temperature measurement, or mechanical manipulation of some parts, etc. The main heater is denoted by 11 and optional bottom heater by 12. The main heater can be implemented as an electrical heater based on the impedance of the heating element and the associated capability to transform electricity to heat. According to an embodiment of the invention the heater element has essentially a pure resistive component to its impedance, and thus to the heat obtained. According to another embodiment of the invention the heater has a significant inductive component contributing to the total impedance. According to an embodiment of the invention, several heater elements can be used for gaining more heating power or flexible and/or more precise adjustment of temperature distribution.

The heating power can also be produced somewhere else in the hot-zone. According to an embodiment of the invention, a bottom heater 12 can be used to heat the charge and/or the melt 5. According to an embodiment of the invention also a surface heater (not shown) can be used at the melt surface region to heat the melt and/or the lower end of the growing crystal.

The structural parts of the hot-zone have usually much higher thermal conductivity than the insulating parts. Structural parts according to the invention are designed in such a manner (paragraphs (1)-(3)) that either (1) They are located inside of the hot-zone insulation, that is, their temperature is high, in the vicinity of the melting point of the material being grown.
(2) They are located outside of the hot-zone insulation, and their temperature is several hundreds ° C. under the above mentioned melting point.
(3) Those few parts that extend on both sides of the insulation, like the crucible shaft 13a in FIG. 1, are constructed in such a manner that the resulting heat loss is small.

The cross sectional area of these parts in category (3) is small compared with the distance that the heat needs to travel from inside of the hot-zone to outside, through the insulation.

There are also some other structural parts of the hot-zone, which need to extend from the hot side to the cold side, but they are not shown in the example of FIG. 1. One boundary between the hot and cold side merits further comment. This is the lower end of the heat shield above the melt, as shown in the example of FIG. 1b. The inner shield 32 and outer shield 30 of the conical member are separated by a thin gap 50, preferably 0.2-2 mm, in order to reduce the heat flow from the hot outer shield 30 to the significantly colder inner shield 32. Furthermore, the contact width in the gap, where there is no thermal insulation, is kept small, preferably 2-8 mm. The inner shield 32 may be hanging from above, according to an embodiment, so that this small gap remains open everywhere. The inner shield 32 may also be supported from below on shield 30, on few predetermined small area spots. Or there may be a non-dusting thermal insulator placed between the shields 30 and 32, in which case the distance between these shields may also be somewhat larger than mentioned above, from 1-20 mm, and the contact width may also be larger than mentioned above. According to an embodiment of the invention, the inner shield 32 is made of graphite, but according to another embodiment, other refractory materials are used, e.g. molybdenum. In an embodiment, the non-dusting thermal insulation can be arranged to be exchangeable according to the parts of the hot zone suitably for various crystals.

FIG. 1 demonstrates also the shaft, rod, wire, or a rope of high temperature compatible metal or other suitable refractory material 80 as well as the pulling mechanism 81 arranged to pull the crystal from the melt. The mechanism 81 comprises in an embodiment of the invention a means arranged to rotate the crystal. In an embodiment the rotation is smooth, and does not change with time, or the changes are very slow. In another embodiment the crystal rotation rate is oscillatory with time. In a further embodiment, the direction of crystal rotation is opposite to that of crucible rotation. In another embodiment, the directions are the same.

The results of using the design schematically shown in FIG. 1 indicate major improvements in the power consumption in the whole process cycle and its process steps from melting to end-cone of a silicon crystal. Electric power consumption is reduced by more than 50% compared with such hot-zone design where no special emphasis is put on efficient thermal insulation in the lower end of the hot-zone, and the parts above the melt do not contain a properly insulated heat shield. As an example, a typical power consumption of a 16" hot-zone (the value 16" denotes the nominal silica crucible diameter used in the hot-zone, i.e. about 400 mm) is about 70-80 kW during the body of the crystal, as it is only about 50-55 kW in a 20-22" hot-zone (crucible diameter about 500-550 mm), with continuous insulation as shown in FIG. 1. The anticipated heat loss for the 20-22" hot-zone would be 110-120 kW at the same level of insulation as in older type 16" hot-zone.

The effect of the efficient insulation becomes even clearer if one considers examples on the openings needed for the purge gas exhaust and the heater electrodes. The smaller 16" hot-zone had only two electrodes for the main heater and two exhausts for the purge gas. The larger 20"-22" hot-zone has four electrodes for the main heater and two for the additional bottom heater, i.e., total of six electrodes, and four exhaust openings for the purge gas. Each electrode and opening has a significant heat loss associated with them, which heat loss can be minimized but not totally avoided. In spite of the considerably larger number of hard-to-avoid openings, the total heat loss is significantly lower than that of the smaller hot-zone. The insulating material 21 can be protected and supported by a shielding member 20, which has a tubular form, and the part 20 is located around the heater 11. The mentioned values are examples and the embodiments apparent thereof are not limited only to the mentioned values.

A good figure of merit is the heat loss per total surface area of the hot-zone according to an embodiment of the invention. In order to keep the estimate easy-to-apply, we calculate the surface area as that of a simple cylinder, which has the same radius as the largest distance of the insulating material from the centerline of the hot-zone. The height of the cylinder is the largest vertical dimension from the bottom of the hot-zone to the highest point. We exclude possible thermally unimportant extensions. The new hot-zone yields 12 kW/m$^2$, as the old hot-zone requires about 30 kW/m$^2$, the values being typical values during the growth of the crystal body.

A further advantage of the efficient insulation is that the temperature distribution inside of the hot-zone is quite uniform. This extends the lifetimes of the structural refractory parts, as the maximum temperatures they experience are only moderately higher than the silicon melting point, and the temperature differences in almost all structural parts are small, reducing thermal stresses. Furthermore, the corrosive action by silicon monoxide emitted by the silicon melt will take place more evenly on the exposed surfaces, and consequently their properties change more slowly and less locally. The maximum temperatures experienced by the silica crucible are also lower, which extends the length of the useful process time before the crucible risks to wear off in such a manner that the crystal yield may decrease.

Furthermore, as the temperature differences in the melt are correspondingly relatively small, the melt flows are also somewhat slower and more stable. Thus the need for additional magnetic field is reduced and, in the case that magnetic field is used, the field values can be relatively low. The insulation can thus influence the need of magnetic field strength during a phase of the growing process.

FIG. 1 demonstrates an example in a situation in which the pulling has been going on to produce the upper part of a crystal. The crystal 4 comprises the crown, which appears as a shoulder, and the body. Although no end cone is shown in FIG. 1, the crystal according to an embodiment may have one later in the process. The crystal 4 has been pulled by using a seed crystal 3 attached to the pulling mechanism 81, which is not shown in detail in FIG. 1, although such mechanism can comprise a flexible metal rope 80 or a rod or a shaft arranged for the pull, and/or the mechanism to rotate the crystal when necessary at a predetermined speed profile according to the phase of growth. The crystal 4 may have a neck 3b to the seed crystal 3 that defines the crystalline structure and/or the orientation of the crystal to be pulled. Such a thin neck is typically used to make the crystal dislocation-free, according to an embodiment known as Dash technique.

FIG. 1 shows the melt 5 inside the crucible 6. The crucible 6 can be made of silica in an embodiment, but in another embodiment other crucible materials can be used for a particular charge to be melted. According to an embodiment, the crucible can be arranged to be replaceable each time after the furnace temperature is lowered to close to room temperature, compared with the melting point of the grown crystal. The crucible may have a surface coating that comprises nitrides, refractory metals, carbon, silicon, and/or carbides. According to an embodiment of the invention, a part or the whole surface of the crucible may be doped with a compound of barium or with other suitable chemical elements that enhance devitrification of the amorphous silica surface.

In FIG. 1 it is demonstrated also that the crucible 6 is surrounded by a susceptor 10. Although the susceptor is drawn into FIG. 1 as a single piece according to an embodiment of the invention, it can be made of several parts, arranged to fit around the crucible. The susceptor can be arranged to conduct heat from the heaters 11 and/or 12, and/or to distribute the heat in a suitably uniform manner to the outer wall of the crucible. The heaters surround the melt in a cylindrically symmetric manner, although the more precise structure of the heaters is not demonstrated in FIG. 1. In an embodiment, the approximate cylindrical symmetry of one or several of the heaters relative to the melt and/or the crystal is abandoned.

Although FIG. 1 shows an embodiment of the invention where the heating element 11 is realized by a single element surrounding the crucible, in another embodiment the heating element(s) can be formed by several parts located to surround the crucible. In addition, in one embodiment, the heating of the melt can be made using a heater, which is shaped to form an electric coil-type structure. The electrical current fed into the heater can have a certain frequency and phase arrangement to create a certain magnetic field distribution in the melt.

According to an embodiment of the invention, in addition to the main heater 11, a bottom heater 12 can be used optionally in addition to the main heater. The bottom heater can be used during the melting of the charge. According to an embodiment of the invention the bottom heater can be used also during the growth of the crystal body. The use can be arranged into a certain phase, or during the whole pull, depending on the thermal conditions desired in the melt and elsewhere inside of the hot-zone, and/or the need for controlling the melt flows during the pull.

FIG. 1 shows a crucible shaft 13a, its outer insulation 13b and the inner insulation 13c of the crucible shaft. These parts are arranged to support the crucible but also for lifting the crucible and/or to maintain rotation of the crucible during the process. The insulation is used according to an embodiment of the invention to preserve the heat in the lower parts of the hot-zone, and to prevent and/or minimize the heat losses via the shaft parts. According to an embodiment of the invention the insulation material 13c can be left out, or it can be embodied as a hollow tube. According to an embodiment, the hollow crucible shaft may also be used as a channel for an additional purge gas flow inlet. According to another embodiment of the invention the channel can be used in suitable part for leading other gases, and/or as a channel for electric wires.

According to an embodiment indicated in FIG. 1 the thermal shield 20 and the insulating part 21 can be used to improve the thermal balance to keep the heat inside the crucible and the melt. The cross section in FIG. 1 demonstrates a cylindrical geometry for the embodiment that comprises the shield 20. However, several other shapes are possible.

According to an embodiment of the invention, the shield 20, the thermal insulator 21, the plate 33 and the conical member are made of separate pieces, but the insulators 21, 31, and 33b form a continuous or almost continuous thermal insulation. Several other realizations are possible, and the number of parts may be larger or smaller than shown in FIG. 1.

The conical member comprises an outer part 30 arranged to reside above the melt. The conical member also comprises an insulation 31 to thermally insulate the melt region from the region of the growing crystal, and to reduce heat loss from inside of the hot-zone. The conical member also comprises the inner part 32 that guides the purge gas flow along the growing crystal down towards the melt. One of the functions of the part 30 is to prevent any particles ejected by the insulating part 31 from accessing the melt surface, as well as to protect the insulating part 31 from the corrosive gases evaporating from the melt. As shown in FIG. 1, the conical member has a cone shape comprising the inner and/or outer parts as well as the insulation there between according to an embodiment, but according to another embodiment of the invention, the thermal insulation fills the space between inner and outer parts only partially, leaving empty space between the insulating part and the inner and/or the outer part. In a further embodiment, the insulation consists of two or more separate pieces. According to another embodiment, the inner and/or outer cones comprise two or several pieces each. According to a even further embodiment, the inner and outer parts are attached to each other using high temperature compatible structural material, which extends through the thermal insulation, but in such a manner that the heat loss through this structure is small. A connection through the thermal insulation allows that the conical member may be handled as a single piece, but according to an alternative embodiment of the invention the parts are separate, and the inner and outer shield and the thermal insulation are handled separately. In a further embodiment the outer diameter of the part 33 is smaller than the inner diameter of the thermal shield 20, and there are additional parts that connect the insulating part 33b to the cylindrical insulating part 21. To the extent that the conical member is located inside of the crucible radius, in FIG. 1 it is shown as a cone. However, a large number of other designs are possible. For example, one alternate shape is shown in FIG. 8. The figures assume a rotationally symmetric design, which is often advantageous from manufacturing point of view, but even significant deviations from rotational symmetry are possible. In an embodiment of the invention, there is only three-fold (120°) symmetry in the conical member, and 4, 5, 6 or more fold symmetries are feasible. In another embodiment, the effective diameter of the opening, through which the crystal is pulled, may be changed during the growth of the crystal, using several suitably shaped parts, which may include thermal insulation, and these parts surround the crystal in a rotationally non-symmetric manner.

According to an embodiment of the invention, the lower end of the hot-zone comprises also the bottom part 40 and the insulation 41, which is arranged to form continuous thermal insulation with the insulating part 21. According to an embodiment of the invention, the insulation comprises openings through insulation 41 for feed-throughs, which are required to provide electric current for the heater, and/or potential feed-throughs for the gas flow outlet. These openings are not shown in FIG. 1. The lower part of the chamber comprises an opening for crucible lift mechanism and there is the corresponding opening in the bottom insulation 41, too. The crucible shaft 13a may be manufactured of material with low thermal conductivity, or thermal insulation 13b and/or 13c may be used to reduce heat loss through the shaft and the corresponding opening in the insulating part 41.

In one embodiment of the invention only a main heater is used, but according to another embodiment of the invention the hot-zone comprises a bottom heater arranged to be used in addition to the main heater. According to an embodiment, the bottom heater is used during melting of the charge and/or during pulling of the crystal.

Any magnets as such that may be used during a crystal pull are not shown in FIG. 1.

FIG. 2 shows one embodiment how the heat loss through the opening for the purge gas outlet may be kept small. The exhaust tube in FIG. 2 is drawn in a schematic manner as a vertical cylinder. However, the inside opening of tube 42 may also be constructed to be conical, or the cross section may be changing in a stepwise manner, or alike. The cross section is preferably circular but it may have another simple shape. If the cross section deviates from circular form, the effective diameter of the opening may be defined to be identical to the diameter of a circle with the same area as the cross sectional opening of the tube 42. The wall thickness of the tube 42 is preferably less than 8 mm, and if it does not carry any significant mechanical load, no more than about 3-5 mm. The effective inner diameter of the tube is preferably less than 60 mm at the narrowest point, and the insulator 41 is at least 1.5 times as thick as the effective inner diameter. The tube 7 located outside the insulation 41 may have an inner diameter which is approximately the same or larger than the inner diameter of the tube 42.

There are two advantages in taking the purge gas out from inside of the hot-zone at this location as depicted in FIG. 2. The additional space requirement caused by the thick insulation 41 at or near the location of FIG. 2 adds very small cost to the grower hardware, specifically to the vacuum chambers. If the outlet is located in the upper part of the hot-zone, in an essentially radial manner, it is difficult to avoid need for larger chamber diameter, with a significant added cost. The other advantage is that the vacuum tubes taking the purge gas to the vacuum pump may now be located under the vacuum chamber, away from the operator working area, which simplifies the design and the normal operation of the grower. Furthermore, the exhaust tube location under the vacuum chamber allows for simple construction and use of a heavy electromagnet around the vacuum chamber, which magnets are often used in conjunction with Czochralski-type growth of silicon.

As the purge gas is sucked from inside of the hot-zone through the openings in the tubes 42, there is always a slightly lower pressure inside the hot-zone than elsewhere inside the main vacuum chamber. That is why very little silicon monoxide will be able to find its way outside of the hot-zone but through the intended path, and the outer surfaces of the hot-zone and inner surfaces of the vacuum chamber remain quite clean for extended periods of operating hours. This has several advantages. The operator workload is greatly diminished, as the vacuum chambers do not need to be cleaned between every run from the inside. Cleaning intervals of 10 or 20 runs are possible, even for those surfaces, which become dirty the fastest. Secondly, the insulators, which are much more susceptible to corrosive action by silicon monoxide than more solid materials like graphite, become very long-lived. We have demonstrated that in the design schematically shown in FIGS. 1-2 nearly all insulating material can be used for at least a year in an almost continuous operation. Furthermore, optical instrumentation like the diameter-measuring camera or temperature measuring pyrometers do not suffer changes caused by dirt on the view ports. All this has a significant influence on productivity and some influence on the yield of the process. The design has also advantages in growth of highly doped silicon crystals where Sb, As or P are used as dopants, but this is not restricted only to the mentioned dopants. The evaporation of these dopants, often as oxides, similarly cause dirt and particles on the surfaces, which tendency is greatly diminished by using the design for the hot-zone according to an embodiment of the invention.

FIG. 3 shows in a schematic manner how a side-flow IIb of the purge gas II has been allowed to stream through the insulation, from the main vacuum chamber above the melt level, towards the purge gas exhaust, in such a manner that this side-flow IIb never comes close to the melt. The path 34 through the insulation 33b is made as a relatively long and narrow channel to avoid excessive loss of heat through the channel. A means of adjusting the flow by partially blocking the channel may be constructed in an embodiment of the invention. According to an embodiment of the invention, the hot-zone structure comprises a cap 33 with an opening, but in another embodiment, a plurality of openings, arranged to allow the flow II to be divided into two sub-flows in a controllable manner According to an embodiment the disk 33a can have a co-axial stack structure of two disks arranged to be pivotable, with openings matching to the location of the channel 34, so that pivoting or rotation of a stack part changes the opening area and thus the flow. According to an embodiment of the invention the path 34 is a short channel. According to another embodiment, the channel 34 comprises a granular, porous, fibrous, or other such structure, made of thermally insulating material that allows fluid to pass. According to an embodiment of the invention, the material is graphite felt.

There are several reasons for this side-flow IIb. As the conical or tubular heat shield constructed of parts 30, 31, and 32 make the purge gas flow IIa pass quite near the melt, the purge gas IIa purges the volatile silicon monoxide out of the melt fairly effectively. It is often necessary to produce silicon crystal material with higher oxygen concentration that this effective purging of oxygen containing gas would naturally yield. Oxygen level in the crystal can be increased by reducing the velocity and/or the mass flow of purge gas IIa over the melt. However, if the total gas flow II is reduced to a too large extent, some silicon monoxide is able to make its way to the wrong direction, upstream, where it partially reacts to form carbon monoxide and partially it condenses to make particles. Carbon monoxide and particles are both very harmful for the growth, and that is why the total argon flow II must be high enough to keep the contamination level low and yield high. The side-flow helps increase the total gas flow to such level that the flow is reasonably small to keep the associated cost small, but at the same time it is sufficiently high to keep unwanted contamination level low.

A second reason for the side-flow IIb is that oxygen level in the crystal tends to drop towards the end of the crystal. That is why the purge gas flow needs to be diminished, as the amount of melt in the crucible becomes smaller. As the melt level remains approximately constant relative to almost all hot-zone parts during the growth, the crucible is lifted during the growth by a significant amount. That part of the purge gas IIa, which flows around the crystal and above the melt then experiences a longer path in a fairly narrow space between the crucible 6 and the heat shield 30. The flow II is therefore redistributed in a natural way so that a smaller portion of the total flow runs above the melt, evaporating the oxygen, and larger portion goes through the side channel 34, not contributing to the evaporation of oxygen, as the crucible is lifted higher.

A third motivation for the side-flow IIb is related to the contamination from the external hot-zone parts above the melt level, and from the inner walls of the main vacuum chamber. Despite the effective insulation there is some heat loss to the external hot-zone surfaces, which are then in a considerably higher temperature than the water-cooled vacuum chamber walls. This results in a natural convection 63 in the space above the hot-zone. This natural convection rotates mainly in the direction shown in FIG. 3, and it tends to bring in contamination to the purge gas flow II, which is directed mainly downwards. Without the side-flow IIb, a significant part of this contamination, carried by the thermal convection 63, will be drawn down towards the melt surface by the purge gas flow IIa. The side-flow IIb acts as a sheath gas and effectively isolates the thermal convective flow 63 from that part of the flow IIa, which sweeps the melt. The contamination carried by the natural convection 63 is then carried directly to the exhaust with no contact to the silicon melt. According to an embodiment of the invention the side flows are separately fed into the chamber, although FIG. 3 shows their feed through the same opening. This may be used to minimize any kind of potential cross contamination probabilities from a channel to another. According to an embodiment of the invention, a special flow guide can be used to better distinguish the flows IIa and IIb from each other. According to an embodiment of the invention, the guide is a conical or a tubular structure mountable on the conical member or on the cap 33. According to another embodiment of the invention, the guide may be attached to the vacuum chamber, with no mechanical contact to the hot-zone. According to an embodiment of the invention, the guide can be provided with a cooling fluid circulation inside the guide, so acting as a cooling element to enhance the cooling rate of the crystal, but also as a trap for the potential contamination in the convection 63.

In one embodiment, the flow has a component that is directed into the furnace, but arranged to provide a flow that is avoiding the hot-zone. Such a flow can be used to protect vacuum chamber walls, windows and other surfaces outside of the hot-zone thermal insulation, from the substances that originate from the melt.

According to an embodiment, FIG. 4 shows an additional tube 22 (not shown in FIG. 1) as a shielding member around the heater that has the purpose of protecting the heater 11 and the susceptor 10 from contact to corrosive silicon monoxide. According to an embodiment of the invention the gas flow is taken to close to the outer periphery of the hot-zone well above the heater, and the silicon monoxide contained within the flow III makes no or almost no contact with the heater or with the outer edge of the crucible 10. At the same time, all lower parts of the hot-zone are protected. In order to protect crucible it is important that the space between the crucible and the gas guiding tube 22 will be kept narrow during the whole growth process from start of the neck to end of the tail, i.e., even though the upper edge of the crucible is raised well above the main heater 11. FIG. 4 shows one possible design but several other designs may be devised.

FIG. 5 shows that during the melting of the polysilicon charge 8, the crucible must be in a much lower position, relative to the conical member, than during the growth. The charge in FIG. 5 is shown in a schematic manner, and thus the pile above the crucible edge is not necessarily in proper scale. While in that melting position, the upper end of the heater is directly visible to the silicon charge. If all of the gas flow is directed over the heater at this stage, there is a significant amount of carbon contamination from the heater and/or from other surfaces above the heater, which is able to react with the outer edge of the already hot silicon charge. In order to purge this contamination away from the silicon charge, an additional gas flow, shown as IIIb, is needed.

In FIG. 5 this flow is created using additional holes or openings 23 trough the protective tube 22. Other possible paths for this flow to the exhaust may of course be easily devised. The flow IIIb merges into the exhaust gases at a second merging region in FIG. 5. The flows IIa and IIb merge at a first merging region in FIG. 5.

This flow IIIb will add some to the wear of the heater, but the flow is only a small portion of the total purge flow over the melt, and the wear will be slow. A preferred but slightly more complicated approach is to change the flow pattern as the charge is almost or fully melted, and the crucible location is high enough, relative to the conical member, so that the additional protection by the flow IIIb is no longer needed. One way of realizing this is a separate path through the thermal insulation of the hot-zone for the flow IIIb and an additional vacuum valve that can be used to cut off or very significantly reduce the flow IIIb. The flow IIIb would then be on during the early phase of the growth process, i.e., most importantly during the melting of the charge, and most of the process time the flow would be off or drastically reduced. As the period, during which the production of oxygen containing gases during the melting step is important, is only a relatively short fraction of the total time that the heater power is on, the wear caused by the silicon monoxide in flow IIIb will correspondingly be quite small.

Almost all of the crystals grown by using the design of FIG. 5 have a low carbon concentration below 0.5 ppma, typically <0.2 ppma, in the end of the body where the solidified fraction g of the melt is g>0.9.

According to an embodiment, FIG. 6 shows schematically, how some hot-zone parts are lifted automatically with the upper part of the vacuum chamber 1a, at the same time as the main vacuum chamber 1 is opened. The chamber must be opened between production batches, the remains of the old silica crucible need to be removed together with residual silicon and the environment of the graphite cleaned. The embodiments of the invention save operator labor especially with large hot-zones, as no manual lifting or special tooling is needed to expose the area to be cleaned. In addition, the invention allows somewhat more flexible hot-zone design, as the weight and dimensions are not limited by the operators' ability to handle the parts in a safe manner. The lifting can be performed in a clean way without introducing particles or other contamination. A further advantage is that parts can be lifted while at more elevated temperature, and the intermediate time between two successive growths is reduced. The lifting is made so that the parts 1a and 1b are separated. This design has been applied in furnaces according to an embodiment of the invention with 20"-22" hot-zones and used with success, but as such is not limited only thereto. FIG. 6 demonstrates an embodiment of the invention wherein the conical member and the plate 33 can be lifted as a single piece, but is not limited only thereto. The conical member is lifted with a wire denoted by 70b in FIG. 6, with an attachment member 70a to the upper part of the chamber 1a. The connecting parts 70b may also be removable, to allow e.g. transfer of the upper hot-zone parts to a cart or other suitable supporting structure outside of the furnace. Although embodied using wires, the lifting can be arranged using a rod, or by many other ways as a skilled man in the art knows from the embodiments of the invention.

In an embodiment of the invention, a separate lifting mechanism 72 is attached to the part 70a. This lifting mechanism 72 may be powered e.g. electrically or mechanically from outside of the vacuum chamber. The mechanism 72 allows lifting of the upper parts of the hot-zone even if the vacuum chamber is closed. In an embodiment of the invention, the additional heat loss caused by the partially opened hot-zone is used to change the temperature distribution within the hot-zone during melting of the charge. In another embodiment of the invention, the additional heat loss caused by the partially opened hot-zone is used to enhance cooling of the furnace, after the growth of the crystal is completed, so increasing the productivity.

FIG. 7 depicts in a more schematic manner how hot-zone parts may be lifted. According to one embodiment the lifting means 71, which can be actually any means arranged to separate the upper part 1a from 1b (see FIG. 1 for parts numbering), in a repeatable manner from one crystal growth run to another. Although the parts shown in FIG. 7 comprise only 1a and 1b, the bottom piece 1c has not been drawn into FIG. 7. According to an embodiment the bottom piece 1c and the middle piece 1b are of the same piece, and in another embodiment, the upper part 1a and the middle part 1b form a single piece.

In FIG. 7 the references 1°, 2° and 3° show lifting of the upper parts according to an embodiment of the invention so that in 1° the parts are together, in 2° part 1a rising (demonstrated by the arrows) and/or lifted and 3° that the top part can be taken aside (direction of movement demonstrated by the arrows) from the chamber part 1b, exposing the lower parts of the hot-zone. However, the step 3° is optional, and in an embodiment of the invention, the step 3° is omitted. There may also be some additional movements of the top part of the chamber needed for easy handling of the hot-zone parts, e.g. lowering of the part 1a after the step 3° or after the step 2°.

FIG. 8 shows in a schematic manner a construction that allows a quick change of the hot-zone parts for different kinds of crystals to be grown. So, the parts that influence the gas flows as well as the thermal environment seen by the crystal may be changed, according to the kind of crystal to be grown. The change may be performed in less than 30 minutes additional time, compared with the normal time needed between subsequent growths, where no parts change is required.

The outer heat shield over the melt is disrupted at such a diameter that the inner part of the outer shield 30b may be lifted up through the inner heat shield 32a, after the lower part of the inner shield 32b and the insulator located underneath 31b have first been lifted up.

The construction shown in FIG. 8 is only one possible example of the design, and thus, without leaving the scope of the embodiments of the invention, several different modifications from the shown example are possible for a skilled man in the art. For instance, the inner part 30b in FIG. 8 has been demonstrated as a plate. However, the design of the shown part may also comprise conical parts in shape or more complicated structures in the design. The insulation 31b may be cut out of soft and flexible material like graphite felt so that its outer diameter may also be slightly larger than the opening in the upper part of the inner shield. The insulation 31b or the shield 30b may also be constructed from several separate pieces. Furthermore, suspension of the shield 32b may be constructed in a different manner, as discussed earlier.

Experience has indicated that embodiments of the invention lead to a good and easy adaptation of the hot-zone parts to e.g. varying diameters of crystals from a process to another, so improving the power consumption, shape of the crystal, gas flow characteristics and/or quality of the crystal. These results are also supported by simulations made on the power consumption, temperature distribution and gas flow.

The parts 32b and/or 32a can be made of carbon-based or other refractory structural material, or they may be more reflective, arranged to reflect the heat from the crystal upwards at least partly. According to an embodiment of the invention, the depicted parts can have a sub-structure of sub-parts so that, for instance, the insulating member 31b may be made of two halves. According to an embodiment the heat transfer and/or cooling of the part 32 or part 32a and/or part 32b is enhanced using a suitable fluid circulating inside the said part(s), so increasing the net cooling of the crystal by radiation. According to an embodiment, the fluid circulation may be internal to the part(s), in a manner similar to a heat pipe. According to another embodiment, the fluid circulation is connected to an external cooling system. According to an embodiment of the invention, the cooled parts may be separate from the cooled parts 32 shown in FIG. 1 or from the parts 32a and 32b shown in FIG. 8, so that the gas flow is guided by the depicted parts, and the enhanced cooling is realized mainly using parts not shown in the figures. According to an embodiment of the invention such additional parts can be located above parts 32a and/or 32b and/or surrounded at least partly by them.

FIG. 9 illustrates an example of how to choose appropriate parts for a crystal growth run. In the beginning the appropriate hot-zone parts (30b, 31b and 32b) are selected to correspond the crystal geometry, particularly the diameter 52 of the crystal to be pulled, and/or according to other considerations. The diameter 51 of the inner opening of the set is matched to the crystal diameter 52 (FIG. 8).

A furnace, according to an embodiment of the invention, for manufacturing a single crystal using the Czochralski-type method comprises:
a crucible for holding the melt,
a heater for heating the crucible to melt the material in the crucible, for making the melt,
a pulling mechanism arranged to pull a crystal from the melt in the crucible,
a vacuum chamber of a crystal growing furnace, which accommodates a hot-zone,
a mechanism for lifting the upper part of the pulling chamber to open the chamber, and in addition
a hot-zone structure consisting of thermally conducting and insulating materials According to an embodiment of the invention the growth chamber is in reduced pressure when pulling. According to an embodiment of the invention, the pressure is essentially the same as ambient pressure in the room. According to an embodiment of the invention the pressure is about as low as realistically achievable in industrial conditions. According to an embodiment of the invention the under pressure is between the just above-mentioned extremes. According to an embodiment, the gases present in the chamber have a predefined composition to define an atmosphere of the pulling. However, the constituents originating from the melt add to the atmosphere, in an embodiment.

According to an embodiment of the invention the grower comprises a support unit providing the necessary purging gases as well as the gases for adjusting the atmosphere of the hot-zone. According to an embodiment of the invention such purging means can purge the grower with an agent comprising Ar and/or He or another suitable gas.

The crucible according to an embodiment of the invention can have a diameter below 20". According to an embodiment of the invention the silica crucible diameter is in the region of about 20-32". According to an embodiment of the invention, the crucible can be even larger, but preferably below 48"

An apparatus according to an embodiment of the invention is an apparatus arranged for manufacturing crystals comprising semiconductor materials. According to an embodiment of the invention the semiconductor material is silicon, germanium or other semiconductor material or their mixture, and may also contain optionally or in addition various dopants such as boron, phosphorus, antimony, arsenic or aluminum.

Also other group IV substances than silicon or germanium can be used in concentrations from less than 1 ppma up to several percent.

A crystal according to an embodiment of the invention has been made by a method according to an embodiment of the invention. According to an embodiment of the invention, the crystal is a semiconductor crystal. According to an embodiment of the invention, the crystal comprises silicon and/or germanium. According to an embodiment of the invention, the crystal comprises at least one element of the group III elements as a dopant. According to an embodiment of the invention, the crystal comprises at least one element of the group V elements as a dopant. According to an embodiment of the invention, the crystal comprises exactly or essentially the structure of sapphire. According to an embodiment of the invention, the crystal comprises the structure of zinc blende. According to an embodiment of the invention, the crystal comprises diamond structure. According to an embodiment of the invention, the crystal comprises also other elements of the group IV elements than silicon and/or germanium.

According to an embodiment of the invention, argon flow is used during the growth. The argon flow as defined as a gas mass flow having an average value less than 50 slpm, according to an embodiment, but according to another, mass flow has an average value less than 35 slpm in 20"-22" hot-zone. According to another embodiment of the invention the mass flow has an average value less than 25 slpm. The values are examples for a furnace with a 100 kg charge and the values may change during the crystal body formation. The values scale approximately with the size of the hot-zone.

According to an embodiment of the invention, the method comprises exposing the melt to magnetic field made so that the magnetic field has a first value at the interface region between the melt and the crystal to be pulled, and a second value somewhere else in the melt. The magnetic field can accelerate the melt movement in the crucible, but also decelerate if necessary by an appropriate selection of the magnetic field. Also vertical movement of the melt can be controlled by a suitable selection of the magnetic field. The required magnetic field strength can be reduced in certain embodiments significantly by the thermal insulation of the hot-zone, so providing more peaceful and/or controllable flows of the melt.

According to an embodiment of the invention, the method comprises exposing the melt to magnetic field having a strength distribution as a function of the location. According to an embodiment of the invention, the method comprises exposing the melt to magnetic field made so that said first value is less than 20 mT and the second value is less than 50 mT elsewhere in the melt. According to an embodiment of the invention, the method comprises exposing the melt to magnetic field in such a way that the magnetic field is essentially symmetric in respect to the crucible rotation axis. According to an embodiment of the invention, the method comprises rotating the melt by magnetic field. According to an embodiment of the invention, the method comprises exposing the melt to magnetic field with a significant deviation from cylindrical symmetry. According to another embodiment of the invention, the magnetic field has a significant time dependency.

The furnace according to an embodiment of the invention comprises a magnet or several magnets arranged to produce magnetic field less than 50 mT in magnitude in the melt region and less than 20 mT at the interface between the crystal and the melt, to be further arranged to be used at least during a part of the growth process. In one embodiment the magnet is arranged to provide a melt flow to reduce the temperature fluctuations in the melt.

A hot-zone arrangement suitable for a Czochralski-type crystal pulling method from a melt, according to an embodiment of the invention, comprises a flow arrangement according to an embodiment of the invention. According to an embodiment of the invention the hot-zone arrangement comprises insulation arranged to thermally insulate the hot-zone in an essentially continuous manner. According to an embodiment of the invention, the outer surface of the susceptor is protected against the vapors from the melt. According to an embodiment of the invention the heater surface is protected against the vapors of the melt. According to an embodiment of the invention the hot-zone arrangement comprises means to provide a pre-heated sheath gas flow to purge any previously said surface for its protection from vapors originating from the melt. According to an embodiment of the invention, the hot-zone arrangement is designed to reduce operator labor.

A hot-zone arrangement, according to an embodiment of the invention, for manufacturing a single crystal using the Czochralski-type method comprises:
  an essentially continuous thermal insulation around the heater and/or the crucible,
  the necessary openings in the insulation for the crystal above the melt surface, for the heater electrodes and for the shaft supporting the crucible.
  holes for exhaust lines and purge gas lines.

The melt can comprise semiconductor material like silicon, germanium or other semiconductor material or their mixture. The melt is achieved from a solid charge using a heater, which can be the main heater, but additionally a bottom heater can be used in addition to the main heater, the bottom heater being used during a part of the melting of the semiconductor material, but also during pulling of the crystal.

The material to be melt for the crystal pulling can comprise at least a dopant of group III or V elements. Dopants such as at least one of the following: boron, phosphorus, antimony, arsenic and aluminum, can be used. Additionally, group IV elements may also be included.

The heating can be made in several ways as a skilled man in the art can see from the embodiments of the invention. The heater can comprise at least one heating element, the main heater, but in one embodiment there can be several heaters. The main heater can be almost purely resistive heater in one embodiment, but in another embodiment at least one heater element comprises a significant inductive component, which is driven by high frequency alternating current or voltage.

In addition to the main heater, there can also be a bottom heater arranged to heat the crucible, and the hot-zone from the bottom. According to an embodiment of the invention the heater has a resistive element that may be fed by direct current (DC). According to an embodiment the element is fed by alternating current (AC), to utilize the inductive properties of the heating element. According to an embodiment the melt surface is heated using an additional heater, in order to keep it in a more uniform temperature, and/or to fine-tune the temperature at the interface region of the melt and the crystal.

According to an embodiment of the invention, the furnace can comprise an insulation that has an energy loss from inside of the hot-zone to water-cooled surfaces of the puller surfaces below 20 kW per $m^2$ averaged over the surface area of the hot-zone. Such an insulation can have typically energy loss below 15 kW/$m^2$, advantageously below 12 kW/$m^2$, but even more advantageously less than 10 kW/$m^2$. The furnace according to an embodiment of the invention comprises graphite felt, used as the main thermally insulating material in the hot-zone. The insulation can be soft and/or rigid in suitable parts. The insulation may comprise parts that are used once, only, but preferably the parts can be used to pull several crystals or batches. In one embodiment aerogel or similar highly porous structure is used in the hot-zone insulation.

According to an embodiment of the invention the melt is partially covered by thermally insulating member. According to an embodiment of the invention the covering member is a plate or a approximately conical surface or their combination. According to an embodiment of the invention the covering member comprises several parts arranged so that the covered surface area is adjustable, even during the growth of the crystal. According to an embodiment of the invention the melt is heated by a surface heater during the crystal pull. According to an embodiment of the invention the covering member comprises a heater.

It is important to the pulling that the purge gas flow rate in the furnace in the appropriate regions is not too large, but efficient enough to preserve and/or to provide the appropriate composition of the gases inside the furnace in the near-vacuum conditions during the pull. According to an embodiment of the invention the flows can be implemented by a flow arrangement for a furnace for manufacturing a single crystal using the Czochralski-type method. Such a furnace can comprise:
(i) a pulling chamber of the crystal-growing furnace, which accommodates a hot-zone, the hot-zone comprising among others:
(i1) a crucible for holding the molten semiconductor material, and
(i2) a heater for heating the crucible to a temperature to melt the semiconductor material in the crucible,
(ii) a pulling mechanism above the crucible to pull the semiconductor crystal from the crucible, Additionally such a flow arrangement further comprises one or more inert gas inlets to the upper part of the pulling chamber
one or more gas outlets from the bottom of the pulling chamber
inert gas flow routes comprising
inert gas flow channel from above to the hot-zone
inert gas flow channel being divided into at least a first route and a second route when entering into the hot-zone.

A Czochralski-type-method according to an embodiment of the invention comprises conducting an inert gas flow from the top of the pulling chamber into the hot-zone through two different routes: a first route and a second route, from which the first route is directed towards the melt along the pulled crystal surface and the second route avoids the melt region.

According to an embodiment of the invention, the flow arrangement comprises said first route arranged as a channel around the crystal defined by a tubular or conical part, and thus arranged so that the flow is arranged to pass to the melt surface region. According to an embodiment of the invention, the flow arrangement comprises a second route, which is arranged as a channel leading through at least one or several orifices through a top cap of the hot-zone supporting the tubular or conical part above the melt, but arranged so that the flow does not to pass to near the melt surface, or the space above the melt surface inside the crucible.

According to an embodiment of the invention the purge gas flow is arranged so that part of the first gas flow and all of the second gas flow are later allowed to mix and guided into the top of the channel between two tubular parts located at a larger radius than the main heater, outside the space where the heater and the susceptor are located, while part of the first flow sweeps the susceptor and the heater, reaching the same channel through one or more orifices in the inner part, in the lower end of the channel.

According to an embodiment of the invention the growth method maintains carbon concentration of a silicon crystal essentially below 0.5 ppma in the end of the body of the crystal, but advantageously below 0.2 ppma, but even more advantageously below 0.1 ppma.

According to an embodiment an apparatus arranged for manufacturing a semiconductor single crystal using the Czochralski-type method comprises a flow arrangement. According to an embodiment of the invention, the crystal to be pulled can comprise a body of a silicon crystal having a diameter between 150 and 220 mm. According to an embodiment of the invention the apparatus comprises means to maintain oxygen concentration of 15+/−1 ppma in the crystal, as measured according to the ASTM F 121-83 standard. According to an embodiment of the invention the said oxygen concentration is less than 15 ppma within a window of +/−1 ppma in the crystal, as measured at or near the centerline of the crystal along the crystal length, for at least 90% of the body length.

An apparatus according to an embodiment of the invention comprises means to monitor and/or input an average argon gas mass flow during the body of the silicon crystal of less than 80 slpm for a crystal that has an oxygen concentration of 15 ppma, but according to another embodiment of the invention the value is less than 60 slpm, and in still another embodiment less than 40 slpm. The argon flows are not bound to the oxygen concentration value shown as an example. The shown flows are averages defined during first 30% of the crystal body length according to an embodiment of the invention, A flow arrangement for a Czochralski-type-method crystal pulling according to an embodiment of the invention comprises_a channel around the crystal defined by a tubular or conical part, the channel opening to the melt surface region, and a second channel leading through one or several orifices through a top cap of the hot-zone supporting the tubular or conical part above the melt, the channel of the second route avoiding the melt surface or the open space above the melt surface. According to an embodiment of the invention the flow arrangement comprises routes for the gas flows through the said first and second routes, and the flows are guided into the top of the outlet channel between two tubular parts located at a larger radius, outside the space where the heater and the crucible are located, where the flows are allowed to mix. In order to take into account quick assembly and/or different types of crystals that can be manufactured by the grower, the flow arrangement can comprise at least two sets of adaptation parts that are used, the selection being made based on e.g. the diameter of the crystal to be grown so that a first set is for a first diameter and a second set is for a second diameter. However, the sets for the adaptation parts can be selected as based on several other ways, for instance by the crystal orientation, resistivity, dopant, etc. The flow arrangement can be designed according to an embodiment of the invention in such a way that the inner diameter of the opening for the crystal, defined by the parts used for the adaptation, is in the range of 1.1 . . . 1.8 times the diameter of the growing crystal, more preferably about 1.2 . . . 1.6 times the diameter of the crystal.

According to an embodiment of the invention, the flow arrangement parts, especially the conical upper part and/or plate-like bottom part can be made of graphite. The insulating part can be made of soft or rigid graphite felt. Suitable parts of graphite can be at least partially coated with Si, dense SiC, and/or diamond film and/or pyrolythic graphite.

According to an embodiment of the invention, the top part of the hot-zone comprises means arranged to make it easier to handle hot-zone parts together with the grower upper parts, The hot zone parts can have interfaces to handling tools for a lift of an individual part or of sub-groups of hot-zone parts. The structure may comprise fast-locking means arranged to lock and/or to release certain parts that are to be lifted from those that are not, as well as guiding structures arranged to guide the parts that are to be lifted.

The embodiments of the invention make the grower/furnace operation by the operators in situations like lifting and/or otherwise handling or replacement of hot-zone parts easy. Such a construction allows the lifting of the upper parts of the hot-zone and also allows the operators an easier approach to the crucible and other parts of the hot-zone. The structure is advantageous when cleaning the hot-zone and removing the used silica crucible and the remaining semiconductor material from the crucible, which increases the productivity. So, time can be saved in the preparation of the furnace for a new run thus increasing the productivity. The crucible can be charged while inside the grower, but according to an embodiment of the invention the crucible can be charged outside the chamber. According to an embodiment the charge is loaded into the crucible and the crucible is lifted together with the charge and susceptor into the grower.

Making the parts of the furnace adaptable to various crystal sizes and easily replaceable gives benefits in cost, quality, yield or productivity compared to the case where crystals with different diameters are grown using a single hot-zone design without other adaptation.

A flow arrangement according to an embodiment of the invention, for a furnace comprising a crucible for a Czochralski-type crystal growth from a melt, comprises at least one inlet-flow channel for a gas flow at a flow entrance of the furnace and at least one outlet flow channel at the gas outlet of the furnace, and in a hot zone there between a flow-guide arrangement, which is, during the growth of the crystal, arranged to divide said at least one inlet flow to a first partial flow and a second partial flow so that said first partial flow is guided along a guiding surface to enter the melt region before the exiting the hot-zone, whereas said second partial flow is arranged to avoid the space in the crucible above said melt, before the exiting the hot-zone.

A flow arrangement according to an embodiment of the invention comprises a guiding surface comprises at least partly a surface that belongs to at least one of the following parts: a support of the seed crystal, seed crystal, crystal, a crystal part, a first disk member, a second disk member, an additional purge tube, and a tubular and/or conical member. A flow arrangement according to an embodiment of the invention comprises said first partial flow comprises means to guide the flow to enter a space facing the charge of which the melt originates from, whereas said second partial flow is arranged to avoid said space facing the charge. A flow arrangement according to an embodiment of the invention comprises at least one of said flows of the arrangement as arranged to inhibit the transference of the evaporative species from the melt to other furnace parts.

According to an embodiment of the invention said first and second partial flow are arranged to merge before exiting the hot zone and/or the furnace, but according to another embodiment to exit the hot zone and/or the furnace separately from each other. According to an embodiment of the invention the flow arrangement is arranged to be operable with such evaporating material that comprises at least one of the following: Si, P, Sb, As, Ge, oxide of Si, oxide of P, oxide of Sb, oxide of As and oxide of Ge. A flow arrangement according to an embodiment of the invention is arranged to be operable with such a gas, which at said inlet flow channel comprises at least one of the following: an inert gas, argon, helium, nitrogen, hydrogen.

According to an embodiment of the invention the tubular and/or conical member can comprise parts that differ form cylindrical and/or disk like parts. According to an embodiment of the invention the form comprises a part towards the grown crystal which part can reflect heat from the cooling crystal.

A flow arrangement according to an embodiment of the invention comprises a tubular and/or conical member co-axially or essentially or co-axially mountable around the axis of the crystal to be grown. A flow arrangement according to an embodiment of the invention comprises in said tubular and/or conical member comprises thermal insulation arranged to insulate an incident part of said first partial flow at a first part of the guiding surface from thermal interaction with the second part of said first partial flow at a second part of the guiding surface, wherein said incident part of the first partial flow is entering the melt surface, and the second part of said first partial flow is leaving the melt surface. A flow arrangement according to an embodiment of the invention comprises said thermal insulation as arranged to insulate from each other the cooling part of the grown crystal and at least a part from the hot zone region of the space in the crucible above said melt.

A flow arrangement according to an embodiment of the invention is arranged so that a tubular and/or conical member has a first reflector surface arranged to reflect thermal radiation from the melt and/or a second reflector surface arranged to reflect thermal radiation from the crystal. A flow arrangement according to an embodiment of the invention is arranged so that the first reflector surface is thermally insulated from said second reflector surface. According to an embodiment of the invention at least one reflector surface is arranged to operate as a flow guide part. A flow arrangement according to an embodiment of the invention is arranged so that the tubular and/or conical member is arranged to preserve the temperature of the secondary part of said first partial flow near the temperature of the melt surface.

A flow arrangement according to an embodiment of the invention comprises in the tubular and/or conical member a first and a second surfaces, which are separated from each other by a gap at the near-melt region. A flow arrangement according to an embodiment of the invention is arranged so that the tubular and/or conical member comprises a first and a second surfaces, which are separated from each other by a gap at the near-melt region. According to an embodiment of the invention the gap is a gap of reflector surface dividing surface of the tubular and/or conical member to said first and second reflector surfaces. According to an embodiment of the invention when support over the gap is needed the separation over said gap is implemented partially punctual support bridges with minimum contact area so avoiding conducting heat across a contact area as much as possible. A flow arrangement according to an embodiment of the invention comprises such tubular and/or conical member that is provided with an opening for a crystal to be grown, such a tubular and/or conical member further comprising at least one part of the following: a first disk member and a second disk member, wherein said part is arranged to, define a gas flow route towards the melt region.

A flow arrangement according to an embodiment of the invention comprises such a flow-guide in the flow arrangement further comprises at least one tubular shielding member as a mountable wall at least partly around the crystal axis or its extension, so that said at least one tubular shielding member is arranged to form at least partly a channel wall for the protection, from the vapors originating to said first partial flow and/or melt, of at least one of the following: a heating element, said crucible, a crucible wall part, a susceptor, crystal and a tubular and/or conical member.

A flow arrangement according to an embodiment of the invention comprises for the first partial flow and/or the second partial flow, a region extending into outlet flow channel at the gas outlet of the furnace, for merging in said region said first partial flow and said second partial flow. A flow arrangement according to an embodiment of the invention is arranged so that a gas outlet is arranged to lead into a collector system arranged to collect such a material that originates to the vapors of said first flow. A flow arrangement according to an embodiment of the invention is arranged so that a collector system in the flow arrangement is a waste management system or a part thereof. A flow arrangement according to an embodiment of the invention is arranged so that the collector system in the flow arrangement is a refinery system or a part thereof, arranged to save collected material.

A flow arrangement according to an embodiment of the invention comprises an additional flow channel extending to the gas outlet of the furnace arranged to supply oxygen or air to the outlet or exhaust line for passivating a constituent of the exhaust gas and/or dust originating from the melt. A flow arrangement according to an embodiment of the invention is arranged so that the flow arrangement materials tolerate vapors and/or dust to be passivated comprising at least one of the following: Sb, As, P, Si, Ge oxide of Sb, oxide of As, oxide of P, oxide of Si oxide of Ge.

A flow arrangement according to an embodiment of the invention is arranged so that the flow guide arrangement is arranged to set a pre-determined heat flux from the melt in a melt temperature to the crystal in a crystal temperature. A flow arrangement according to an embodiment of the invention is arranged so that the flow guide arrangement is arranged to provide a minimum heat flux via at least a part of the insulation in the flow guide arrangement. A flow arrangement according to an embodiment of the invention is arranged so that the flow guide arrangement is arranged to guide a flow to inhibit phase transition of the vapors in the second part of said first partial flow before the outlet. A flow arrangement according to an embodiment of the invention is arranged so that the merging region location is adjustable by a valve set comprising at least one valve operable for said merging region location adjustment. A flow arrangement according to an embodiment of the invention is arranged so that the merging region location is adjustable according to the phase of the crystal growth.

A flow arrangement according to an embodiment of the invention is arranged so that the merging region is set to a first region in a first phase of the crystal growth and to a second region in a second phase of the crystal growth. A flow arrangement according to an embodiment of the invention is arranged so that, between a first and second phase of crystal growth, said first region and said second region are both arranged to be at least partly operable as merging regions. A flow arrangement according to an embodiment of the invention is arranged so that the first and second regions are used as merging regions simultaneously for an entering part of a flow of the first partial flow and/or second partial flow. A flow arrangement according to an embodiment of the invention is arranged so that the merging region is arranged adjustable via a special flow channel to a region outside the growth chamber of the grower.

A flow arrangement according to an embodiment of the invention is arranged so that the merging region comprises a part that is arranged to condensate and/or receive material formed from vapors originating to the melt carried by an entering flow to said region. A flow arrangement according to an embodiment of the invention is arranged so that the flow arrangement, it comprises means to guide a third flow originating to said first partial flow, which third flow is one flow of a plurality of additional flows comprising at least one flow, to a merging region. A flow arrangement according to an embodiment of the invention is arranged to set the sum and/or ratio of said first partial flow and said second partial flow is kept constant during the crystal pull and/or a process step in a crystal pull.

A flow arrangement according to an embodiment of the invention comprises means to set the ratio of the flow rate of the first partial flow to said second partial flow to decrease towards the end of the crystal body during growth of the body of the crystal. A flow arrangement according to an embodiment of the invention is arranged so that the ratio has a first value with a first amount of material in the crucible and a second value with a second amount of material in the crucible, wherein said material comprises the charge and/or melt. A flow arrangement according to an embodiment of the invention is arranged so that when the material in the crucible is arranged to change from a first amount to a second amount as a stimulus, said first value of the ratio is arranged to change to a second value as a response to said stimulus.

A flow arrangement according to an embodiment of the invention comprises at least one of the following: crucible, susceptor, a shielding member, a merging region, the charge, the melt surface having a level according to the phase of the growth, the crystal surface part of the pulled crystal and a tubular and/or a conical member arranged to define the flow geometry of a particular flow in the furnace during the crystal growth or a phase of it. A flow arrangement according to an embodiment of the invention said particular flow is at least one of the following: first partial flow, second partial flow, a merged flow, a part of any of the just mentioned.

A flow arrangement according to an embodiment of the invention is arranged so that the flow arrangement comprises flow-controlling means operable to adjust the gaseous constituent composition of a first partial flow and/or a second partial flow, to a pre-determined composition of the constituents according to the phase of pulling. In a flow arrangement according to an embodiment of the invention, at least one of the gas flows is guided into the channel between at least a first part and a second part from which said first and/or second part has a cylindrical, essentially cylindrical, strictly cylindrical, conical, essentially conical, planar and/or approximately planar geometry. In a flow arrangement according to an embodiment of the invention said at least two parts are selectable from the following ensemble of objects to form a set for setting a flow geometry: a crucible, a susceptor, a first shielding member, a second shielding member, a first disk, a second disk, a tubular and/or conical member, melt surface, surface of the charge, surface of the crystal, a sub-structure part of said object.

A flow arrangement according to an embodiment of the invention is arranged so that at least two of the objects define a first route defined as a channel around the crystal defined by the crystal surface and a shielding member or a tubular and/or conical member, the channel opening to the melt surface region being defined by the melt surface and the first disk or the outer part of the tubular and/or conical member. A flow arrangement according to an embodiment of the invention is arranged so that a second route is defined as a channel leading through one or several orifices through the second disk to form a second route for the second partial flow avoiding the melt surface and the open space in the crucible above the melt surface. A flow arrangement according to an embodiment of the invention is arranged so that the flow is an inlet flow to the grower having an average gas mass flow of less than 50 slpm as averaged over the process step of growing the body of the crystal. A flow arrangement according to an embodiment of the invention is arranged so that said average value is less than 35 slpm. A flow arrangement according to an embodiment of the invention is arranged so that the said average value is less than 15 slpm. A flow arrangement system according to an embodiment of the invention is arranged so that the system comprises a first set for a first flow arrangement for a first crystal with a first characteristic measure and a second set for a second flow arrangement for a second crystal with a second characteristic measure. A flow arrangement according to an embodiment of the invention is arranged so that the system comprises a sub set of mountable parts to form a flow arrangement for growing a crystal to be grown to have the characteristic measure. A flow arrangement according to an embodiment of the invention is arranged so that the first characteristic measure is in a first range and a second characteristic measure is a second range of measures of crystals. According to an embodiment of the invention measures can be combinable for a certain further measure in suitable part. A flow arrangement system according to an embodiment of the invention is arranged so that said set comprises a first disk, second disk, a tubular and/or conical member, heat insulation in the tubular and/or conical member. A flow arrangement according to an embodiment of the invention is arranged so that the opening of a first disk, second disk, a tubular and/or conical member is in the range of about 1.0-2.5 times the diameter of the crystal, but according to another embodiment of the invention is in the range of about 1.02-1.7, but according to a further embodiment is in the range of about 1.2-1.4.

A flow arrangement system according to an embodiment of the invention is arranged so that at least one of the following ensemble of objects to form a set for setting a flow geometry for a flow arrangement: a crucible, a susceptor, a first shielding member, a second shielding member, a first disk, a second disk, a tubular and/or conical member, melt surface, surface of the charge, surface of the crystal, a sub-structure part of said object, is made or at least coated by a coating comprising at least one of the following: graphite, a metal, a composite, a refractory material, pyrolythic graphite, diamond film, a carbide, a nitride and/or a compound of a metal of rear-earth group. A flow arrangement system according to an embodiment of the invention is arranged so that at least one of said parts is coated at least partly by a coating provided by a CVD-coating method, ion-coating method, plasma-coating method and/or electrical discharge utilizing coating. A flow arrangement system according to an embodiment of the invention is arranged so that at least one of said parts is made or at least partly coated by a coating comprising at least one of the following: Si, C, N, Nb, Ta, W, Co, Mo.

A hot-zone structure according to an embodiment of the invention, for a furnace for Czochralski-type crystal growth, comprises:
    a crucible for holding a charge and/or the melt,
    at least one heater for melting the material in the crucible and/or keeping the material in the molten state during the growth of the crystal, and
    essentially continuous thermal insulation surrounding at least the crucible and the heater to reduce the heat loss and/or the heating power consumption during melting and/or crystal growth.

A hot-zone structure according to an embodiment of the invention comprises as thermally important feed-throughs through said insulation at least feed-throughs: for the crystal, for the heater electrodes of a heater, for the crucible shaft, for the crystal above the melt surface and for the purge gas. A hot-zone structure according to an embodiment of the invention is arranged so that the hot zone comprises a feed-through for the crystal where the inner diameter of the part defining the inner-most diameter of the opening of the feed-through and/or the inner diameter of the thermal insulation in the tubular and/or conical member is less than 1.5 times the diameter of the body of the crystal. A hot-zone structure according to an embodiment of the invention is arranged so that the hot zone comprises a feed-through for the crystal where the inner diameter of the part defining the inner-most diameter of the opening of the feed-through and/or the inner diameter of the thermal insulation in the tubular and/or conical member is less than 1.4 times the diameter of the body of the crystal.

A hot-zone structure according to an embodiment of the invention is arranged so that the hot-zone comprises a feed-through through the thermal insulation for an exhaust line arrangement arranged to lead exhaust gases through and/or out of the hot zone region. A hot-zone structure according to an embodiment of the invention is arranged so that the insulation has at least locally a thickness of 1.5 times of the effective diameter of the exhaust line at the penetration region. A hot-zone structure according to an embodiment of the invention is arranged so that the hot zone has a an exhaust line that has an effective inner diameter of the exhaust tube or exhaust tubes below 60 mm at the narrowest point.

A hot-zone structure according to an embodiment of the invention is arranged so that the hot zone comprises a thermal insulation capable to set the heating power consumption per surface area of the hot-zone to a value below $20 \text{ kW/m}^2$ during more than 90% of the body of the crystal, according to another embodiment of the invention the value advantageously being below $15 \text{ kW/m}^2$, but even more advantageously below $10 \text{ kW/m}^2$ according to an even further embodiment of the invention.

A hot-zone structure according to an embodiment of the invention comprises a flow arrangement according to an embodiment of the invention.

A hot-zone structure according to an embodiment of the invention comprises materials that are at least partly penetrated by magnetic fields so facilitating a use of magnet arranged to produce a magnetic field into a melt region during at least part of the melting and/or crystal growth.

A hot-zone structure according to an embodiment of the invention comprises a shielding member arranged to protect the outer surface of the crucible or susceptor against the vapors that could have being in contact with the melt. A hot-zone structure according to an embodiment of the invention comprises a thermal arrangement arranged to adjust the temperature of the crucible, susceptor, a hot-zone part, a grower part related to the charge, the melt and/or the crystal.

A hot-zone structure according to an embodiment of the invention is arranged so that the thermal arrangement and/or a part of it comprises a shield arranged to protect against the vapors originating to the melt. A hot-zone structure according to an embodiment of the invention is arranged so that the thermal arrangement is arranged operable to adjust the crystal temperature, the radial and/or axial crystal temperature profile in respect to the temperature of the melt, but in an another embodiment in respect to a certain part of the hot-zone. According to an embodiment of the invention the thermal arrangement comprises a heater. According to another embodiment of the invention the thermal arrangement comprises a cooler. According to an embodiment of the invention the thermal arrangement comprises supply for a heater and/or a cooler. According to an embodiment of the invention the thermal arrangement comprises means to control the electricity, and/or the mass flow of the heaters and/or coolers of the thermal arrangement.

A hot-zone structure according to an embodiment of the invention is arranged so that the furnace comprises means to provide a sheath gas flow to flow on a surface of a member of the thermal arrangement, a shield of such and/or over an opening through the insulation, in order to provide protection from the melt-constituent originating vapors and/or particles.

A hot-zone structure according to an embodiment of the invention comprises at least one heater arranged to heat the charge and/or the melt, situated at least partly to surround the crucible. A hot-zone structure according to an embodiment of the invention comprises at least one bottom heater arranged to heat the charge and/or the melt. A hot-zone structure according to an embodiment of the invention comprises at least one surface heater approximately at the charge and/or melt surface level of the crucible, arranged to heat the charge and/or the melt.

A hot-zone structure according to an embodiment of the invention is arranged to comprise at least one heater that has at least two heating elements arranged to at least partially compensate magnetic field of each other, while arranged to heat the charge and/or the melt. A hot-zone structure according to an embodiment of the invention is arranged to comprise an induction-based heater arranged to heat at least one of the following: the charge, melt, susceptor, crucible, and other hot-zone part.

A hot-zone structure according to an embodiment of the invention comprises a heater arranged to heat the grown crystal. According to an embodiment of the invention such a heater is a part of the thermal arrangement arranged to adjust the temperature of the crystal and/or hot zone. A hot-zone structure according to an embodiment of the invention comprises a cooling member arranged to cool the crystal or a part of it. A hot-zone structure according to an embodiment of the invention said cooling member comprises a cooling cylinder arranged to provide circulation of the cooling medium. A hot-zone structure according to an embodiment of the invention comprises means in the hot zone structure to generate a magnetic field into the melt.

A furnace according to an embodiment of the invention, for Czochralski-type crystal growth, comprises:
  a crucible for holding a charge and/or the melt,
  a thermal arrangement comprising a heater and controlling means for it for heating the crucible to a temperature to melt the material in the crucible,
  a pulling mechanism arranged to pull a crystal from the melt crucible,
  a growth chamber arranged to seal at least said crucible, and said heater into an atmosphere for growing a crystal to be grown, and
  a hot zone structure according to an embodiment of the invention.

A furnace according to an embodiment of the invention can further comprise one or more gas inlets and/or outlets for gases to/from the growth chamber. A furnace according to an embodiment of the invention comprises a route for the gases, which comprises leading means to lead the gas leaving the furnace through the bottom of the growth chamber. A furnace according to an embodiment of the invention comprises means to route at least one flow, which is arranged to address and/or to keep the furnace operable for growing a crystal, through a route comprising a valve and/or an orifice plate comprising therein in a plurality of orifices at least one orifice arranged to control said flow to a flow state from a shut off state to a fully open state. According to an embodiment of the invention, said flow can be a flow directed to the melt surface region and/or a flow directed to avoid the melt surface region. A furnace according to an embodiment of the invention can comprise means to collect at least one constituent of the exhaust gases.

A furnace according to an embodiment of the invention comprises a flow channel arranged to supply oxygen or air to a channel leading to exhaust channel, for passivating a component of the gas and/or dust originating from the melt. A furnace according to an embodiment of the invention is arranged so that the vapors and/or dust to be passivated comprises of one or several of the following: Sb, As, P, Si, an oxide of Sb, an oxide of As, an oxide of P, an oxide of Si. A furnace according to an embodiment of the invention is arranged so that controlling of said flow is implemented by a flow controller arranged to adjust the effective area of at least one or more orifices.

A furnace according to an embodiment of the invention comprises thermally insulating material between the crucible and the crystal and/or between said crucible and the gas outlet channel.

In a furnace according to an embodiment of the invention, said insulating material is a member of a set arranged to be operable for growing a crystal to be grown to a characteristic measure in a range of characteristic measure of the crystal. The crucible diameter is not limited to a particular value, but according to an embodiment of the invention the crucible diameter is in the region of about 16"-132".

A furnace according to an embodiment of the invention comprises at least a heater which is at least one of the following: a wall-heater, bottom heater, a surface heater near the melt surface, a radiation heater, an induction-based heater, an eddy-current based heater, an external heating element, and an internal additional removable heating element, wherein said heater is arranged to be operable alone or in combination with another heater in a phase of crystal pull. A furnace according to an embodiment of the invention comprises a cooler arranged to enhance the cooling of the grown crystal.

A furnace according to an embodiment of the invention is arranged so that a heater that is arranged to melt a charge and/or to keep it in a molten form as a melt, with a power consumption per initial charge weight and/or with a power consumption per initial melt weight during the neck below 0.7 W/g during more than 90% of the body of the crystal. A furnace according to an embodiment of the invention comprises a heater with a total power consumption below 55 kW during more than 90% of the body of the crystal. A furnace according to an embodiment of the invention comprises an insulation having energy loss from inside the hot-zone to water-cooled surfaces of the puller surfaces below 20 kW per $m^2$ of surface area of the hot-zone, during more than 90% of the body of the crystal. A furnace according to an embodiment of the invention comprises an insulation having energy loss below 15 $kW/m^2$, advantageously below 12 $kW/m^2$, but even more advantageously less than 10 $kW/m^2$, during more than 90% of the body of the crystal. A furnace according to an embodiment of the invention comprises an insulation having power consumption below 15 $kW/m^2$, advantageously below 12 $kW/m^2$, but even more advantageously less than 10 $kW/m^2$, during more than 90% of the body of the crystal.

A furnace according to an embodiment of the invention comprises an insulation having energy loss as defined as including the feed through openings or holes in said insulation in the hot-zone.

A furnace according to an embodiment of the invention comprises a magnet arranged to produce a magnetic field into the melt. In a furnace according to an embodiment of the invention said magnet is arranged to produce a magnetic field of less than 50 mT in a melt region. According to an embodiment of the invention said magnet is arranged to produce a magnetic field less than 20 mT in the interface between the crystal and the melt. In a furnace according to an embodiment of the invention, said magnet is arranged for providing a flow into the melt for reaching smaller temperature variations within the melt region and/or within the melt region in the vicinity of the crystal-melt interface compared with the temperature variations due to the melt flow without a magnet.

A furnace according to an embodiment of the invention comprises an insulation having graphite felt. According to a variant an embodiment it is used as the main thermally insulating material in the hot-zone. A furnace according to an embodiment of the invention comprises highly porous material. According to a variant of an embodiment of the invention it comprises the main thermally insulating material in the hot-zone.

A furnace according to an embodiment of the invention comprises vacuum means to evacuate the growth chamber to a certain pressure. Such means can be implemented by a pump or a group of pumps and flow controllers arranged to control the vacuum and/or the suction of a pump of the pump group. A furnace according to an embodiment of the invention comprises atmosphere means arranged to arrange the atmosphere composition in the growth chambers. Such means can be implemented by a gas source comprising gas in pressure and a controller to control the amount of the gas to be released into the growing chamber of the furnace, to the hot zone and/or into the first and/or second partial flow of the flow arrangement.

A furnace according to an embodiment of the invention comprises a crucible with a diameter that is in the region of about 16-132". Such crucible can be of quartz or silica, but it can be coated by a coating. A furnace according to an embodiment of the invention is arranged to be utilizable for pulling of parallel crystals each having a characteristic dimension of its own. A furnace according to an embodiment of the invention comprises a feeding means arranged to feed a crucible, of group of crucibles comprising at least one crucible, by a dopant, charge and/or melt.

A grower according to an embodiment of the invention, for Czochralski-type crystal growth, comprises at least:
    a growth chamber,
    inside the growth chamber attachment means arranged to attach a hot zone part of the hot zone structure according to an embodiment of the invention.

A grower according to an embodiment of the invention is arranged so that attachment means are arranged so that at least one of said hot zone part comprised by a pre-determined ensemble of hot zone parts of said hot zone structure is arranged liftable. A grower according to an embodiment of the invention comprises a mechanism to open and seal an upper part of the growth chamber. In a grower according to an embodiment of the invention, said mechanism further comprises arrangement for a lift and/or pivot of said upper part. A grower according to an embodiment of the invention comprises means to arrange said hot zone part liftable having the growth chamber sealed. A grower according to an embodiment of the invention comprises means to arrange said at least one hot zone part to be liftable and/or pivotable with an upper part of the growth chamber. In a grower according to an embodiment of the invention the mechanism is arranged to provide an access to an assembled hot zone structure and/or a pre-determined ensemble of them. According to an embodiment of the invention said ensemble comprises a tubular and/or conical member, an insulator, crucible, susceptor, and/or a heater. A grower according to an embodiment of the invention is arranged so that said access comprises a special access for at least one of the following: cleaning a hot-zone part, removing material from crucible, removing material from the susceptor, replacing a hot-zone part, charging crucible, adapting hot-zone part to a certain characteristic dimension of a crystal to be grown.

A grower according to an embodiment of the invention comprises rotating means arranged to provide rotational movement for at least one first rotatable object selectable from the following: the charge, the melt, a crucible and a crystal to be pulled in respect to a second rotatable object which is different than said at least one first rotatable object. A grower according to an embodiment of the invention comprises a growth chamber, which comprises a top part and a bottom part. A grower according to an embodiment of the invention can further comprise a growth chamber comprising a middle part. A grower according to an embodiment of the invention comprises an arrangement to mount said hot zone so that it can extend towards to the bottom part region when the growth chamber is sealed. A grower according to an embodiment of the invention comprises a mechanical connection between the said at least one hot-zone part and said top part of the growth chamber. A grower according to an embodiment of the invention is arranged so that the connection is releasable for normal operation.

A grower according to an embodiment of the invention comprises an arrangement to mount a first set of hot zone parts adapted to a first or a first range of characteristic measure of a crystal and a second set of hot zone parts adapted to a second or a second range of characteristic measure of a crystal, said sets arranged to be interchangeable between a first crystal growth and a second crystal growth processes. In a grower according to an embodiment of the invention, said characteristic measure is at least one of the following: diameter of the crystal, orientation of the crystal, dopant, resistivity of crystal.

A furnace according to an embodiment of the invention comprises a grower according to an embodiment of the invention and a hot-zone structure according to an embodiment of the invention.

A growing method of crystals according to an embodiment of the invention comprises a preparing the apparatus, pulling the crystal and making post-puling operations, but in the preparatory phase, the method comprises selecting a set of hot zone parts and/or insulating parts to fit into the grower for a growth of a certain crystal within a range of characteristic measure of a crystals according to the set. A growing method of crystals according to an embodiment of the invention comprises a phase of selecting charge to be loaded for providing the melt from which the crystal is to be pulled.

A growing method of crystals according to an embodiment of the invention comprises a phase of selecting the seed crystal or alike for providing the crystal to be pulled with the crystal structure thereof. A growing method of crystals according to an embodiment of the invention comprises adjusting the atmosphere and/or the gas flows in the hot-zone. A growing method of crystals according to an embodiment of the invention comprises cooling of pulled crystal. A growing method of crystals according to an embodiment of the invention comprises exposing the melt to a magnetic field. A growing method of crystals according to an embodiment of the invention comprises opening the growth chamber for taking the crystal out. A growing method of crystals according to an embodiment of the invention comprises cleaning the growth chamber after growing the crystal and/or after taking the crystal out.

A growing method of crystals according to an embodiment of the invention comprises:
feeding a gas flow for an atmosphere to a growth chamber, dividing an input gas flow to the growth chamber into a first partial flow and a second partial flow,
leading an incident part of said first partial flow towards the melt surface for forming a secondary part of said first partial flow by a guiding surface,
insulating said incident and secondary parts of said first partial flow from each other for maintaining the temperature of the secondary part of the first partial flow at or close to the melt temperature,
leading at least said first partial flow to exit the hot zone,
leading a second partial flow, to avoid the melt in the crucible and/or the crystal-pulling region, as a sheath gas flow to an exit.

According to an embodiment of the invention the method comprises a phase of insulating thermally the neck of the crystal from the melt at least partly. A growing method of crystals according to an embodiment of the invention comprises in the pulling phase a rotating at least one object of the following: the crystal to be pulled, the crucible, the susceptor, and the melt in respect to another.

According to an embodiment of the invention the method comprises rotating in such a way that at least the rotation direction, angular velocity and/or the angular momentum of a first one of said objects is different than that of another one of said objects. According to an embodiment of the invention the method comprises rotating in such a way that the rotating comprises accelerating, maintaining and/or decelerating the rotation of at least a part of the melt by a magnetic field.

According to an embodiment of the invention the method comprises rotating in such a way that a magnetic field is arranged to constitute a force for moving the melt in a flow that comprises a vertical component in a region of the melt. According to an embodiment of the invention, exposing the melt to magnetic field having a strength distribution as a function of the location. In a growing method of crystals according to an embodiment of the invention said exposing the melt to the magnetic field is made so that the magnetic field has a first value in a first range of values at the interface region between the melt and the crystal to be pulled and a second value in a second range of values somewhere else in the melt.

According to an embodiment of the invention the method comprises utilization of such a magnetic field that is practically symmetrical with the crucible rotation axis or its extension. According to an embodiment of the invention the method comprises utilization of a magnetic field by a dc current or a current essentially a dc current. According to an embodiment of the invention the method comprises utilization of such a magnetic field that has a first value, which is less than 20 mT. According to an embodiment of the invention the method comprises utilization of such a magnetic field that has a second value, which is less than 50 mT. According to an embodiment of the invention the method comprises utilization of such a magnetic field so that it contributes to limiting and/or adjusting the magnetic field strength to values, which do not cause any, or major increase in the radial inhomogeneity of crystal constituent concentration.

According to an embodiment of the invention the method comprises utilization of such a magnetic field that has local average over a time period, which is essentially symmetric in respect to the crucible rotation axis.

According to an embodiment of the invention the method comprises utilization of such a magnetic field that is adjustable in the method for controlling at least a flow component of the melt. According to an embodiment of the invention the method comprises utilization of such a magnetic field that can be used for controlling a composition constituent concentration in the melt and/or in a certain part of it. According to an embodiment of the invention the method comprises utilization of such a magnetic field that can be used for controlling the constituent concentration of the crystal or a part thereof. According to an embodiment of the invention said constituent is oxygen or comprises oxygen.

According to an embodiment of the invention a rotating magnetic field or rotating field component thereof is implemented by varying magnetic field strength of electromagnets around the melt. According to an embodiment of the invention the rotating magnetic field or rotating field component is implemented by a mechanical rotation of at least one permanent magnet into a direction around the melt. According to an embodiment of the invention the rotating magnetic field or rotating field component thereof is implemented by mechanical rotation of at least two permanent magnets each into a direction of its own around the melt.

A growing method of crystals according to an embodiment of the invention comprises feeding gas comprising Ar during the pull. A growing method of crystals according to an embodiment of the invention comprises feeding gas so that the average mass flow of said gas during the body of a crystal is less than 50 slpm, more preferably less than 30 slpm, for a crystal, which has an average oxygen concentration of about 14-16 ppma according to ASTM F 121-83 units. According to an embodiment of the invention, another known constituent as such can be used in the gas.

A growing method of crystals according to an embodiment of the invention comprises a method for a silicon crystal. A growing method of crystals according to an embodiment of the invention comprises a method for a germanium crystal. A growing method of crystals according to an embodiment of the invention comprises a method for a crystal comprising an element from the carbon-group. A growing method of crystals according to an embodiment of the invention comprises method is a method for a crystal comprising dopant from III-group. A growing method of crystals according to an embodiment of the invention comprises method is a method for a crystal comprising dopant from V-group.

A crystal according to an embodiment of the invention is a crystal made according to an embodiment of the invention.

A crystal according to an embodiment of the invention comprises a semiconductor crystal. A crystal according to an embodiment of the invention comprises a crystal, which is a single crystal. A crystal according to an embodiment of the invention comprises silicon, germanium and/or their mixture. A crystal according to an embodiment of the invention comprises at least one element of the III-group, IV-group or V-group of element as a dopant.

According to an embodiment of the invention the crystal can comprise exactly or essentially the crystal structure of sapphire. According to another embodiment of the invention the crystal has a structure of zinc-blende. According to another embodiment of the invention the crystal can comprise the crystal structure of wurzite. According to an embodiment of the invention the crystal can comprise the crystal structure of diamond. According to an embodiment of the invention the crystal can comprise the crystal structure of rock salt.

A crystal according to an embodiment of the invention comprises at least one of the following: boron, phosphorus, antimony, arsenic, aluminum, gallium, indium or a combination of at least two mentioned in any proportion. A crystal according to an embodiment of the invention comprises a body of a crystal composition and/or structure according to an embodiment of the invention having a diameter between 150 and 1100 mm. A crystal according to an embodiment of the invention comprises a body of a silicon crystal having a diameter between 150 and 500 mm. A crystal according to an embodiment of the invention comprises a body of a silicon crystal having a diameter between 150 and 220 mm.

According to an embodiment of the invention the crystal comprises an oxygen concentration level in the crystal and/or in the melt in an acceptable level or within an acceptable range, defined by a target value and a tolerance or, alternatively, by an acceptable upper and/or lower limit. According to an embodiment of the invention the oxygen target value for the crystal is a value in the range 0.5-25 ppma, more preferably in the range 3-17 ppma, according to ASTM F 121-83 units. According to an embodiment of the invention the tolerance for the oxygen concentration of the crystal is better than +1 ppma according to ASTM F 121-83 units.

According to an embodiment of the invention the crystal the concentration for the crystal is an average defined in a certain part of the grown crystal. A crystal according to an embodiment of the invention has a carbon concentration essentially below 0.5 ppma in the end of the body of the crystal and/or at a position of the body where about 90% of the initial charge has been pulled. A crystal according to an embodiment of the invention has a carbon concentration below 0.2 ppma, advantageously below 0.1 ppma, but more advantageously below 0.03 ppma.

According to an embodiment of the invention, a furnace according to an embodiment of the invention comprises dopant means arranged to provide at least one dopant into the melt and/or charge. The dopant can be added into the charge in several ways, and/or in parts or portions by dopant means of particular kind, in solid phase and/or in gaseous phase. According to an embodiment of the invention the dopant means comprises means to add at least one dopant into the melt in a gaseous phase, when the melt is in the molten phase, or onto the charge before the melting and/or during the melting.

A skilled man in the art, having read and understood the application, should realize, that said first flow and said second flow do not limit the number of the flows that flow into the furnace and/or out of the furnace. So said first flow and said second flow are indicated as to embody in illustrative manner the routing of at least two flows in the furnace via at least two different ensembles of routes, from which at least one route ensemble is directed towards the melt surface, and at least another route ensemble avoiding the melt. At least one flow can be used as a sheath gas flow to have the furnace and/or a part of it, the melt and the crystal protected against contamination originating from the gases, melt, its constituents, and/or constituents formed via a chemical reaction from the substances in the furnace during a growth run.

While several embodiments of the present invention have been shown and described, it is to be understood that many changes and modifications may be made without departing from the spirit and scope of the invention as defined in the claims below.

The invention claimed is:

1. A hot zone structure for a Czochralski crystal growth, comprising:
 a thermally insulated shielding member configured to allow an inlet flow to stream inside the thermally insulated shielding member as a first partial flow and a second partial flow, said first partial flow being guided through a melt region;
 a crucible; and
 the melt region that comprises a region above said crucible and between said crucible and said thermally insulated shielding member, and a region inside said crucible;
 wherein the thermally insulated shielding member comprises a channel inside a structure of said thermally insulated shielding member, said channel being configured to guide said second partial flow for preventing said second partial flow from interacting with said thermally insulated shielding member in said melt region and said first partial flow in said melt region.

2. The hot zone structure according to claim 1, wherein the thermally insulated shielding member is further configured to guide said first partial flow to enter a space facing a charge of which a melt originates from, and to prevent said second partial flow to interact with said space facing the charge.

3. The hot zone structure according to claim 1, wherein the thermally insulated shielding member is further configured to merge said first and second partial flow before exiting the hot zone structure and/or the furnace.

4. The hot zone structure according to claim 1, wherein the thermally insulated shielding member is further configured to enable said first and second partial flow to exit the hot zone structure and/or the furnace separately from each other.

5. The hot zone structure according to claim 1, wherein the thermally insulated shielding member further comprises a tubular shielding member as a mountable wall at least partly around a crystal axis or its extension, so that said tubular shielding member is arranged to form at least partly a channel wall for the protection, from vapors originating from said first partial flow and/or a melt, of at least one of the following: a heating element, said crucible, a crucible wall part, a susceptor, crystal and a tubular and/or conical member.

6. The hot zone structure according to claim 1, wherein said hot zone structure comprises, for the first partial flow and/or the second partial flow, a region extending into an outlet flow channel at a gas outlet of a furnace, for merging in said region said first partial flow and said second partial flow.

7. The hot zone structure according to claim 1, wherein at least one of the following: said crucible, a susceptor, said thermally insulated shielding member, a merging region, a charge, a melt surface having a level according to a phase of the growth, a crystal surface part of the pulled crystal and a tubular and/or conical member defines a flow geometry of a particular flow in a furnace during the crystal growth or the phase of it.

8. The hot zone structure according to claim 1, wherein at least one of the partial flows is guided into a channel between a first part and a second part from which said first and/or second part has a cylindrical, essentially cylindrical, strictly cylindrical, conical, essentially conical, planar and/or approximately planar geometry.

9. The hot zone structure according to claim 1, wherein said hot zone structure further comprises a first set configured to set a flow geometry for a first flow arrangement for a first crystal with a first characteristic measure and a second set configured to set a flow geometry for a second flow arrangement for a second crystal with a second characteristic measure.

10. The hot zone structure according to claim 1, wherein said hot zone structure further comprises the crucible for holding a charge and/or a melt, a heater for melting a material in the crucible and/or keeping the material in the molten state during the crystal growth, and essentially continuous thermal insulation surrounding at least the crucible and the heater to reduce a heat loss and/or heating power consumption during melting and/or crystal growth.

11. A furnace for a Czochralski crystal growth, comprising a hot zone structure comprising:

a thermally insulated shielding member configured to allow an inlet flow to stream inside the thermally insulated shielding member as a first partial flow and a second partial flow, said first partial flow being guided through a melt region;

a crucible; and the melt region that, comprises a region above said crucible and between said crucible and said thermally insulated shielding member, and a region inside said crucible, wherein the thermally insulated shielding member comprises a channel inside a structure of said thermally insulated shielding member, said channel being configured to guide, the second partial flow for preventing said second partial flow from interacting with said thermally insulated shielding member in said melt region and said first partial flow in said melt region.

* * * * *